United States Patent [19]

Redford et al.

[11] Patent Number: 5,847,694

[45] Date of Patent: Dec. 8, 1998

[54] APPARATUS FOR GENERATING A SIGNAL INDICATIVE OF THE POSITION OF A MOVABLE ELEMENT IN THE APPARATUS

[75] Inventors: Peter M. Redford, Los Gatos; Donald S. Stern, San Jose, both of Calif.

[73] Assignee: TV Interactive Data Corporation, San Jose, Calif.

[21] Appl. No.: 359,307

[22] Filed: Dec. 19, 1994

Related U.S. Application Data

[63] Continuation-in-part of Ser. No. 280,699, Jul. 26, 1994, abandoned, which is a continuation-in-part of Ser. No. 76,032, Jun. 15, 1993, Pat. No. 5,459,489, Ser. No. 804,240, Dec. 5, 1991, Pat. No. 5,339,095, Ser. No. 868,835, Apr. 15, 1992, Pat. No. 5,218,771, and Ser. No. 298,648, Aug. 31, 1994, abandoned.

[51] Int. Cl.⁶ ........................................................ G09G 5/08
[52] U.S. Cl. ............................................ 345/158; 345/161
[58] Field of Search ................................. 345/156, 157, 345/158, 165, 166, 175, 161, 180, 182, 183; 348/734; 273/438, 148 B, 434, DIG. 28; 250/227.13, 239, 568, 221; 235/472; D14/114, 116; 45/603

[56] References Cited

U.S. PATENT DOCUMENTS

| | | |
|---|---|---|
| 2,415,168 | 2/1947 | Gieseke . |
| 3,096,650 | 7/1963 | Lowenstein et al. . |
| 3,360,653 | 12/1967 | Phares . |
| 3,371,424 | 3/1968 | Sweet ........................................ 33/206 |
| 3,569,717 | 3/1971 | Awojobi et al. . |
| 3,863,067 | 1/1975 | Gooley ................................ 250/231 R |
| 3,886,361 | 5/1975 | Wester .................................... 250/221 |

(List continued on next page.)

FOREIGN PATENT DOCUMENTS

| | | |
|---|---|---|
| 841864 | 11/1989 | Finland . |
| 3303-103-A | 1/1983 | Germany . |
| 3236436 | 3/1984 | Germany . |
| 63-63905 | 3/1988 | Japan . |
| 8500817 | 5/1986 | Netherlands . |
| 154030 | 3/1962 | U.S.S.R. . |
| 800637 | 1/1981 | U.S.S.R. . |
| 1244489 | 7/1986 | U.S.S.R. . |
| 2238382 | 5/1991 | United Kingdom . |
| WO 90/13792 | 11/1990 | WIPO . |

OTHER PUBLICATIONS

"A High–Precision Differential Photometer", A. N. Salharov and B. V. Novogtudskii, Jan. 1994, pp. 1222–1223.

"Horowitz and Hill: The Art of Electronics", Paul Horowitz, et al., Cambridge University 1980, pp. 164–165.

(List continued on next page.)

*Primary Examiner*—Chanh Nguyen
*Attorney, Agent, or Firm*—Skjerven, Morrill, MacPherson, Franklin & Friel LLP; Alan H. MacPherson; Omkar K. Suryadevara

[57] ABSTRACT

A position sensing controller, sometimes referred to as "controller" includes a novel optical gate that is located adjacent to a light source and to a light sensor. The optical gate changes the amount of light incident on the light sensor in response to a change in position of a movable element in the controller. In response to the incident light, the light sensor drives a position signal on an output terminal, which position signal approximately indicates the position of the movable element. The position signal can drive any electrically controllable device, such as a game machine, a personal computer and an interactive television set top. The use of optical principles in a position sensing controller allows various optical position sensing parts of the controller, such as the light source, the light sensor, and the optical gate to be physically separated from each other and so avoid the mechanical wear and tear caused by friction in conventional controllers.

56 Claims, 20 Drawing Sheets

Microfiche Appendix Included
(2 Microfiche, 43 Pages)

U.S. PATENT DOCUMENTS

| | | |
|---|---|---|
| 4,040,743 | 8/1977 | Villaume et al. . |
| 4,148,014 | 4/1979 | Burson . |
| 4,154,000 | 5/1979 | Kramer .................................... 33/366 |
| 4,316,155 | 2/1982 | Hanisko .................................... 331/18 |
| 4,430,526 | 2/1984 | Brown et al. ............................. 178/18 |
| 4,514,732 | 4/1985 | Hayes, Jr. . |
| 4,533,827 | 8/1985 | Fincher .................................... 250/221 |
| 4,565,999 | 1/1986 | King et al. . |
| 4,594,562 | 6/1986 | Gurke et al. . |
| 4,642,459 | 2/1987 | Caswell et al. ......................... 250/227 |
| 4,651,023 | 3/1987 | Parsonage . |
| 4,677,428 | 6/1987 | Bartholow .............................. 340/708 |
| 4,682,159 | 7/1987 | Davison .................................. 340/709 |
| 4,685,678 | 8/1987 | Frederiksen ........................... 273/148 |
| 4,701,048 | 10/1987 | Tokuda et al. . |
| 4,712,885 | 12/1987 | Dawson et al. ........................ 350/443 |
| 4,746,879 | 5/1988 | Ma et al. . |
| 4,748,323 | 5/1988 | Holiday .................................. 250/221 |
| 4,755,801 | 7/1988 | Gooley ................................... 340/566 |
| 4,787,051 | 11/1988 | Olson ..................................... 364/518 |
| 4,839,838 | 6/1989 | La Biche et al. ................. 364/709.11 |
| 4,862,172 | 8/1989 | Ross ....................................... 341/157 |
| 4,864,647 | 9/1989 | Harrington ............................. 455/603 |
| 4,866,602 | 9/1989 | Hall ........................................ 364/200 |
| 4,868,896 | 9/1989 | Pietzsch . |
| 4,883,926 | 11/1989 | Baldwin ................................. 178/18 |
| 4,939,482 | 7/1990 | Nergaard et al. . |
| 5,013,926 | 5/1991 | Aizawa . |
| 5,045,843 | 9/1991 | Hansen .................................. 340/709 |
| 5,059,958 | 10/1991 | Jacobs et al. .......................... 340/706 |
| 5,063,376 | 11/1991 | Chang .................................... 340/706 |
| 5,068,645 | 11/1991 | Drumm .................................. 340/710 |
| 5,086,197 | 2/1992 | Liou ....................................... 178/18 |
| 5,097,353 | 3/1992 | Fujiwara et al. ....................... 359/177 |
| 5,115,236 | 5/1992 | Kohler ................................. 340/825.69 |
| 5,117,099 | 5/1992 | Schmidt . |
| 5,142,655 | 8/1992 | Drumm .................................... 379/52 |
| 5,166,819 | 11/1992 | Eichel .................................... 359/189 |
| 5,223,709 | 6/1993 | Pettypiece, Jr. . |
| 5,288,078 | 2/1994 | Capper et al. ...................... 273/148 B |
| 5,297,061 | 3/1994 | Dementhon et al. .................. 364/559 |
| 5,355,147 | 10/1994 | Lear . |
| 5,363,120 | 11/1994 | Drumm . |
| 5,459,489 | 10/1995 | Redford . |

OTHER PUBLICATIONS

Excerpt from Texas Instruments, Inc. manual entitled TLC55M, TLC555I. TLC555C LinCMOS™ TIMERS; D2784, Sep. 1983—Revised Oct. 1988, pp. 4–195.

Excerpt from Texas Instruments, Inc. manual entitled TLC556M, TLC556I, TLC556C DUAL LinCMOS™ TIMERS; D2796, Feb. 1984—Revised Oct. 1988, pp. 4–203 and 4–204.

*Analog Integrated Circuits Data Book, vol. 10*, Precision Monolithics, Inc., 1990, pp. 7–50 to 7–56.

Graeme, J., "Divide And Conquer Noise In Photodiode Amplifiers," *Electronic Design Analog Applications Issue*, Jun. 27, 1994, pp. 10, 12, 14, 16–18, 22, and 26.

Graeme, J., "Filtering Cuts Noise In Photodiode Amlifiers", *Electronic Design Analog Applications Issue*, Nov. 7, 1994, pp. 9–10, 12, 15–18, and 20–22.

Linear Applications Databook, National Semiconductor, Widlar, Robert J., "Monolithic Op Amp—The Universal Linear Component", (FIG. 10, Analog multiplier/divider), 1986, p. 11.

Linear Applications Databook, National Semiconductor, Widlar, Robert J., "New Op. Amp Ideas", (FIG. 21 Opto–electric Pyrometer with Transmitter), Linear Applications Databook, National Semiconductor, 1986, p. 499.

"Nonlinear Circuits Handbook", Analog Devices, Inc., Jan. 1976, pp. 1–28.

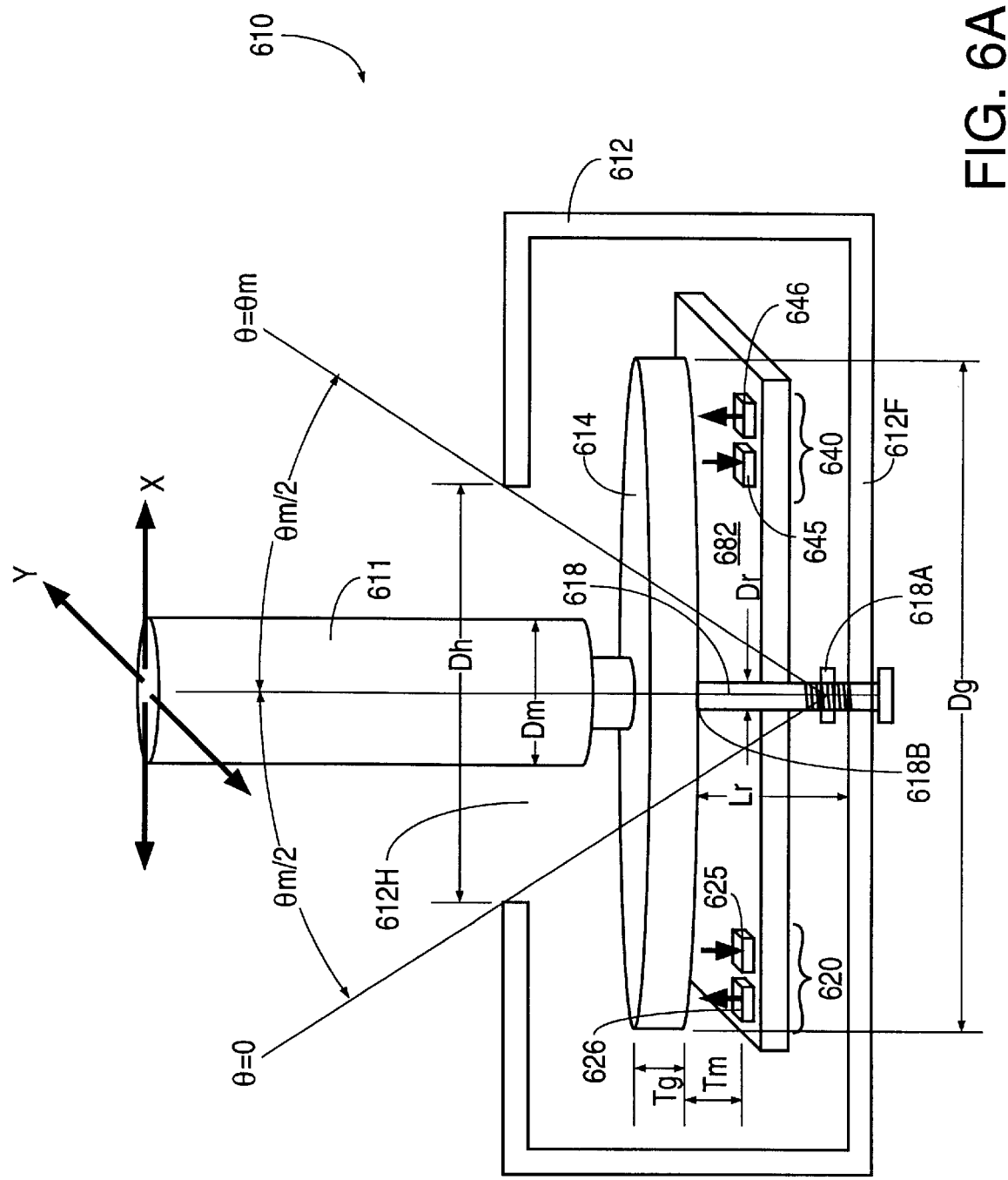

APPARATUS FOR GENERATING A SIGNAL INDICATIVE OF THE POSITION OF A MOVABLE ELEMENT IN THE APPARATUS

CROSS-REFERENCES TO RELATED APPLICATIONS

This application is a continuation-in-part of U.S. patent application Ser. No. 08/280,699 now abandoned "Position Sensing Controller and Method for Generating Control Signals" filed Jul. 26, 1994, which is a continuation-in-part of (i) U.S. Pat. application Ser. No. 08/076,032 "Handheld Electronic Remote Control Device filed Jun. 15, 1993, now U.S. Pat. 5,459,489 issued on Oct. 17, 1995, (ii) U.S. patent application Ser. No. 07/804,240 "Multimedia Pointing Device" filed Dec. 5, 1991 and issued as U.S. Pat. No. 5,339,095 on Aug. 16, 1994 and (iii) U.S. patent application Ser. No. 07/868,835 "Orientation Sensing Apparatus" filed Apr. 15, 1992 and issued as U.S. Pat. No. 5,218,771 on Jun. 15, 1993, all of which are incorporated herein by reference in their entirety.

This application is also a continuation-in-part of U.S. patent application Ser. No. 08/298,648 "Infrared Communication Apparatus And Method Between A Controller And A Controlled Device", filed Aug. 31, 1994, now abandoned which is also incorporated herein by reference in its entirety.

This application is also related to concurrently filed, commonly owned U.S. patent application Ser. No. 08/359,306 now U.S. Pat. No. 5,650,608 issued Jul. 22, 1997 and, entitled "Method and Apparatus for Generating Ratiometric Control Signals" by Peter M. Redford and Donald S. Stern that is incorporated herein by reference in its entirety.

REFERENCE TO MICROFICHE APPENDIX

Microfiche Appendices A (of 1 sheet and 26 frames) and B (of 1 sheet and 19 frames) list two variations of code for use in a microcontroller, are part of the present disclosure and are incorporated herein in their entirety.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

This invention relates generally to a position sensing controller and in particular to a controller that measures the position of a movable element that is movably supported by a housing of the controller.

BACKGROUND OF THE INVENTION

Conventional position sensing controllers are used to control various devices, for example, an airplane, a robot arm, a crane, a helicopter and a video game machine. Position sensing controllers include, for example a video game joystick, also known as a "game controller", or a "gamepad," that can control a game machine to play a video game, such as a flight simulator. A game machine can be, for example, (1) a computing device dedicated to executing video games, (2) a personal computer or (3) an interactive television set top. Many conventional position sensing controllers use a potentiometer and suffer mechanical wear and tear caused by friction between the wiper and the resistive element of the potentiometer.

Certain game controllers use a lever that controls four direction switches. Each direction switch controls movement of an object in one of four directions, e.g. North, South, East and West. Other game controllers include four direction switches connected to four keys of a keypad. Such switch-based game controllers limit a user to turning a direction switch on or off.

As an example of a prior art game controller, consider a racing car video game in which pressing a left direction key turns a car left, in an "all or nothing" action that creates difficulty in controlling the video game's car with the precision that is possible, for example in a real-life car. With an "all or nothing" switch, even if the driver wants to turn the car by a small angle (for example 5°) to follow a gradual curve of the road ahead, the wheels of the car respond to the small angle turning of the steering wheel by turning all the way to the maximum limit (such as 20°) which forces the driver to quickly turn the steering wheel the other way to compensate for oversteering, thereby resulting in very erratic control of the car. In some cases, the car's turning angle depends on the amount time the steering wheel is held in a turned position. Alternatively, use of an "all or nothing" switch can be analogized to steering a real-life car by touching a push-button switch that turns the wheels to a set position at a predetermined angle, such as 20°.

Push-button switch based devices include, for example the control box disclosed by U.S. Pat. No. 5,059,958, issued Oct. 22, 1991 to Jacobs et al. in which "The appropriate signal is generated by employing encapsulated mercury bulb switches" (Col. 3, lines 24–28). The mercury switches have "a series of incremental reservoirs wherein each reservoir has two electrodes that are shorted when the ball of the conductive fluid is manipulated into any one of the reservoirs". (Col. 3, lines 12–16).

SUMMARY OF THE INVENTION

In accordance with this invention, a position sensing controller, also referred to as a "controller", includes a novel optical gate that is located in an enclosure of a housing and adjacent both to a light source and to a light sensor. The optical gate changes the amount of light from the light source that is incident on the light sensor, in response to a change in position of a movable element in the controller. The position of a movable element can be changed by a user through a predetermined range of movement with respect to the housing of the controller. Depending on the amount of incident light, the light sensor supplies a current that indicates the position of the movable element. Such a current can be used to generate any "position signal" used to drive an electrically controllable device, such as a game machine, a personal computer or an interactive television set top.

Use of optical principles in a position sensing controller of the type described above allows various optical position sensing parts of the controller, such as the light source, the light sensor and the optical gate, to be physically separated from each other, and thereby eliminate mechanical wear and tear of the type caused by friction in conventional controllers. A controller based on optical principles has a long life, is simple to construct, is inexpensive and needs less maintenance, as compared to conventional joysticks.

In one embodiment of a controller, the light source is a light emitting diode and the light sensor is a photodiode that is sensitive to the light from the light emitting diode. The light emitting diode and the photodiode are optically shielded or sealed in the enclosure of the controller's housing to minimize noise or error caused by direct ambient light. In one alternative embodiment, the optical gate includes a diffuse light reflector and in another alternative embodiment, a direct light reflector. In two variations of these two embodiments, the reflector has either an approximately flat surface or an approximately spherical surface.

A movable element of a controller can take the form of a tilt adjuster, a sliding adjuster or a rotary adjuster that is capable of only tilt movement, sliding movement or rotary movement respectively with respect to the housing of the controller. A tilt adjuster can be, for example, a joystick or a trackball of a D-pad controller for a game machine. A sliding adjuster can be, for example a balance knob of a stereo system. A rotary adjuster can be, for example a steering wheel of a racing car simulator or a thumbwheel of a handle-shaped controller. In one embodiment of a controller with a handle-shaped housing, the movable element is formed as a flexible portion of the handle.

A controller can include a novel electrical device, henceforth "ratiometric sensor," that uses a first photodiode connected in series with an electrical device, such as a potentiometer or a second photodiode, between a first voltage source and a second voltage source to generate a voltage, henceforth "ratiometric voltage" at a junction between the photodiode and the electrical device. The ratiometric voltage is proportional to the ratio of the equivalent resistance of the first photodiode to the sum of the equivalent resistances of the first photodiode and the electrical device.

A user can tune the ratiometric voltage by changing the resistance of the potentiometer, by for example rotating a rotary wiper, so that the current through a variable resistor in the potentiometer equals the current generated by the first photodiode, as indicated by a display device, to define a neutral position of the movable element. A user can use a controller's movable element that is coupled to the optical gate to reduce (or increase) the amount of light incident on a first photodiode, and in a controller with two photodiodes to simultaneously increase (or reduce) the amount of light incident on the second photodiode, depending on the distance of the movable element from a predetermined neutral position.

A controller that uses non-contact principles, such as optical principles, and also includes one or more ratiometric sensors, can generate an analog signal (such as voltage or current) indicative of the position of a movable element, and the analog signal can be sampled with any predetermined degree of precision, due to the error free nature of the analog signal. Moreover, a controller can have any number of ratiometric sensors, for example for supplying two analog signals that indicate the position of a movable element along X and Y axes.

BRIEF DESCRIPTION OF THE DRAWINGS

FIG. 6A illustrates a controller that includes a flexible member 618 having a first end connected to housing floor 612F and a second end coupled to movable element 611 by optical gate 614.

DETAILED DESCRIPTION

A position sensing controller 110, sometimes referred to as "controller", controls the operation of an electrically controllable device, such as a game machine 190 (FIG. 1A), a personal computer or an interactive television set top. Various types of game machine 190 are available from, for example, Sega, Inc., 130 Shoreline Drive, Redwood City, Calif. Nintendo, Inc., 4820 150th Avenue, N.E., Redmond, Washington and 3DO, Inc., 600 Galveston Drive, Redwood, Calif.

In addition to game machines, video games can be played on a personal computer (P.C.) with a controller that uses conventional mouse signals defined in for example "Mouse Programming Guide", that is available from Microsoft Corporation, One Microsoft Way, Redmond, Wash.

Figure 1A:
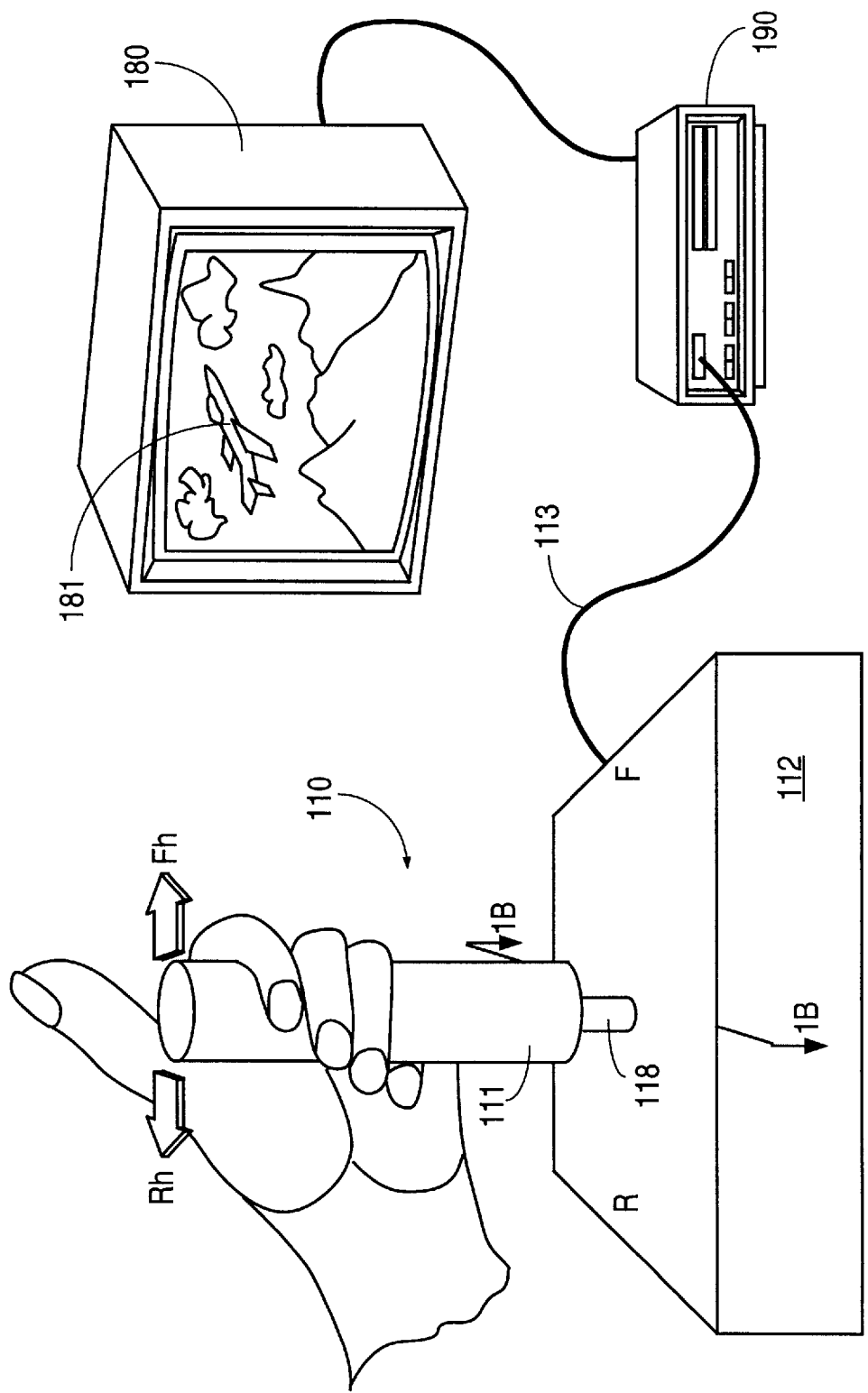
FIG. 1A illustrates a perspective view of one embodiment of a controller for use with a game machine.

In the specific embodiment of FIG. 1A, a controller 110 controls the display of a flight simulator video game on a display device, such as television 180. Specifically, moving a movable element, for example by tilting a tilt adjuster, such as a handle 111 of controller 110 in a forward direction indicated by arrow Fh causes game machine 190 to simulate increased thrust in the forward direction, by moving airplane 181 faster than, for example the cruising speed of airplane 181 when handle 111 is in the neutral position in the center of controller 110. Similarly, tilting handle 111 in a reverse direction indicated by arrow Rh causes game machine 190 to simulate application of reverse thrusters, thereby slowing down airplane 181.

Controller 110 (FIGS. 1B and 1C) has various optical position sensing parts, such as optical gate 114, light emitting diode 125 and photodiodes 116 and 117 all enclosed in an enclosure 113 formed by a housing 112 that is typically formed of opaque plastic (but which can be formed of any appropriate opaque material). Photodiodes 116 and 117 are attached to opposite walls of housing 112, e.g. a rear wall 112R and a front wall 112F, each wall having a height H (of four centimeters in one embodiment) and separated by a distance D (also of four centimeters in one embodiment) from each other. Light emitting diode 125 is located on floor 112B of housing 112.

Figure 1B:
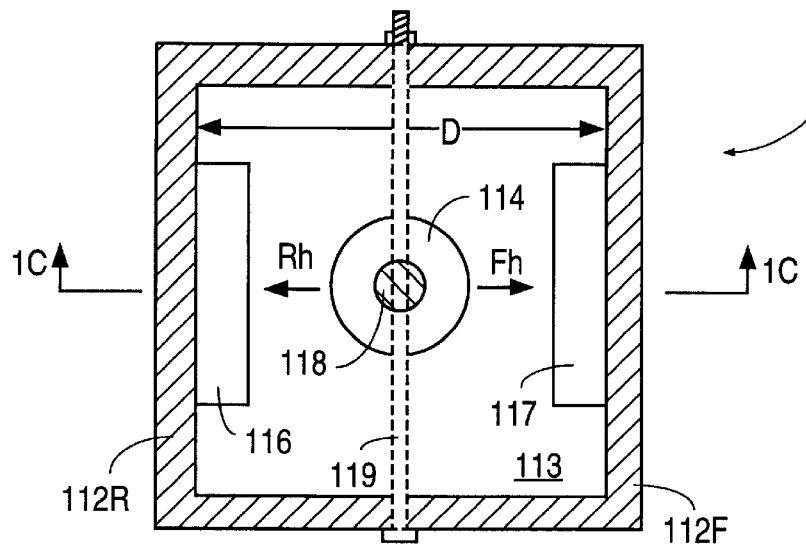
FIGS. 1B and 1C illustrate cross-sectional, top and side views of a controller in directions 1B—1B and 1C—1C of FIGS. 1C and 1B respectively.
Figure 1C:
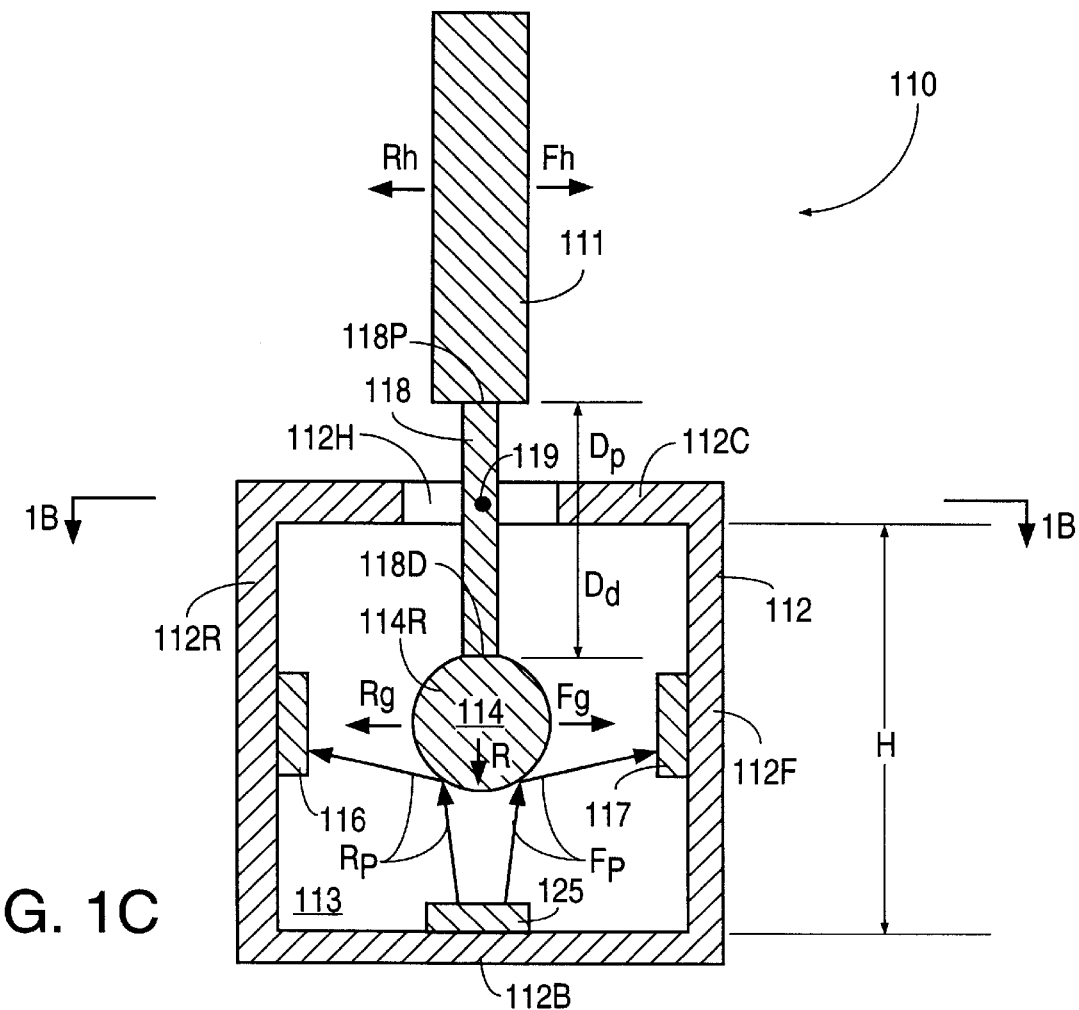

In one embodiment of the type shown in FIGS. 1B and 1C, photodiodes 116 and 117 are both BPW34S, while light emitting diode 125 is SFH420N, all of which are available from Siemens Components, Inc. 10950 N. Tantau Avenue, Cupertino, Calif.

Controller 110 has a lever 118 (FIG. 1C) that is typically formed of plastic, passes through a hole 112H and is pivoted about a pivot rod 119 fixedly attached to housing 112. Lever 118 has a proximal end 118P located close to a user, and distal end 118D in enclosure 113. Pivot rod 119 located at ceiling 112C of housing 112 supports lever 118, such that proximal end 118P and distal end 118D are at distances Dp and Dd (both of one centimeter in one embodiment) from the center line of pivot rod 119.

A handle 111 located at proximal end 118P and an optical gate 114 located at distal end 118D can both be formed integral with lever 118. Handle 111, lever 118 and optical gate 114 can be made of, for example, injection molded plastic. Optical gate 114 performs a gating function by changing the amount of light incident on photodiodes 116 and 117, depending on the position of handle 111.

To perform the gating function, optical gate 114 is located in light paths Rp and Fp from light emitting diode 125 to photodiodes 116 and 117, respectively. Optical gate 114 has a reflecting surface 114R of an approximately spherical shape of radius R (of 0.5 centimeter in one embodiment), and center located approximately coincident with the center of walls 112F and 112R. In one specific embodiment, reflecting surface 114R has a flat, low gloss, white finish, such as a finish provided by flat white paint or uncoated white paper, but can have a metallic finish that reflects direct light.

Initially, handle 111 is in a neutral position, for example approximately perpendicular to ceiling 112C (FIG. 1C), and optical gate 114 is located symmetric, e.g. approximately centered, between photodiodes 116 and 117, thereby reflecting an approximately equal amount of light from LED 125 to each of photodiodes 116 and 117. In a controller that includes two photodiodes, such as photodiodes 116 and 117, a neutral position of a movable element is that position wherein the photodiodes each supply an approximately identical current, henceforth "neutral current."

As handle 111 is gradually moved from the neutral position in, for example direction Fh, lever 118 moves optical gate 114 in direction Rg that is opposite to direction Fh and so gradually increases the amount of light from light emitting diode 125 that is incident on photodiode 117 and simultaneously decreases the amount of the light incident on photodiode 116. In response to the increased amount of light, photodiode 117 supplies more current than the neutral current, while photodiode 116 supplies less current than the neutral current. A ratiometric sensor of the type described below in reference to FIGS. 9 to 12 can use photodiodes 116 and 117 to generate a position signal that approximately indicates the position of the movable element.

The optical position sensing parts of controller 110, such as optical gate 114, light emitting diode 125 and photodiodes 116 and 117 do not contact each other and so eliminate mechanical wear and tear caused by friction of the type found in conventional controllers. The only friction in controller 110 is between lever 118 and pivot rod 119. Therefore controller 110 has a long life compared to conventional joysticks and potentiometric devices.

Controller 110 can have a smaller height H (FIGS. 1B and 1C), distance D and weight than conventional joysticks because controller 110 does not require the numerous mechanical linkages commonly found in conventional joysticks. For example, one embodiment of controller 110 has height H of one centimeter and distance D of one centimeter (FIGS. 1B and 1C) for use in a keyboard of a lap-top personal computer. Such a small controller has greater sensitivity and permits larger movement of the moveable element, as compared to a conventional lap-top keyboard mouse that uses force sensing resistors. Controller 110 is also simpler to construct and less expensive than conventional joysticks.

Figure 10:
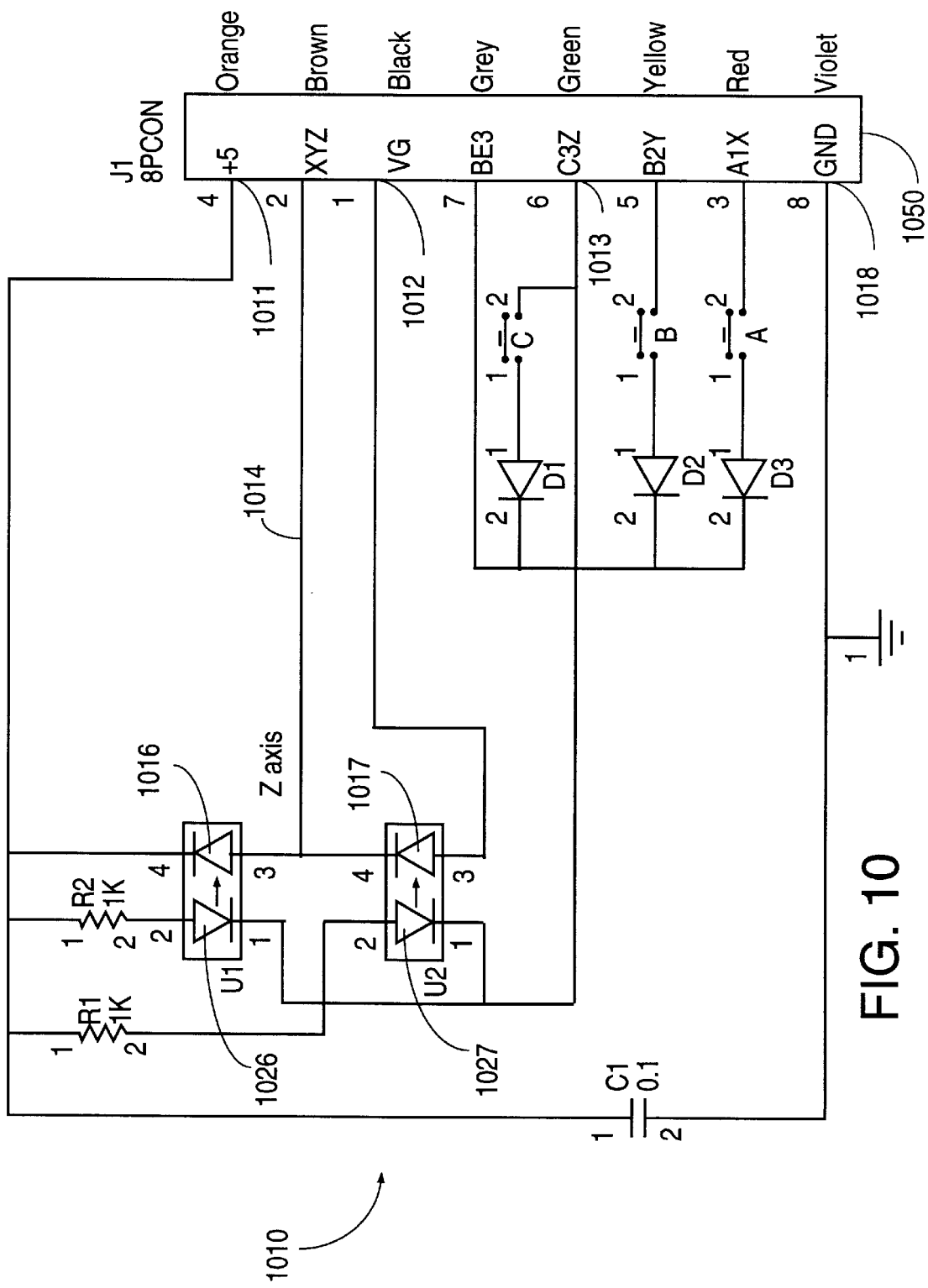
Figure 11:
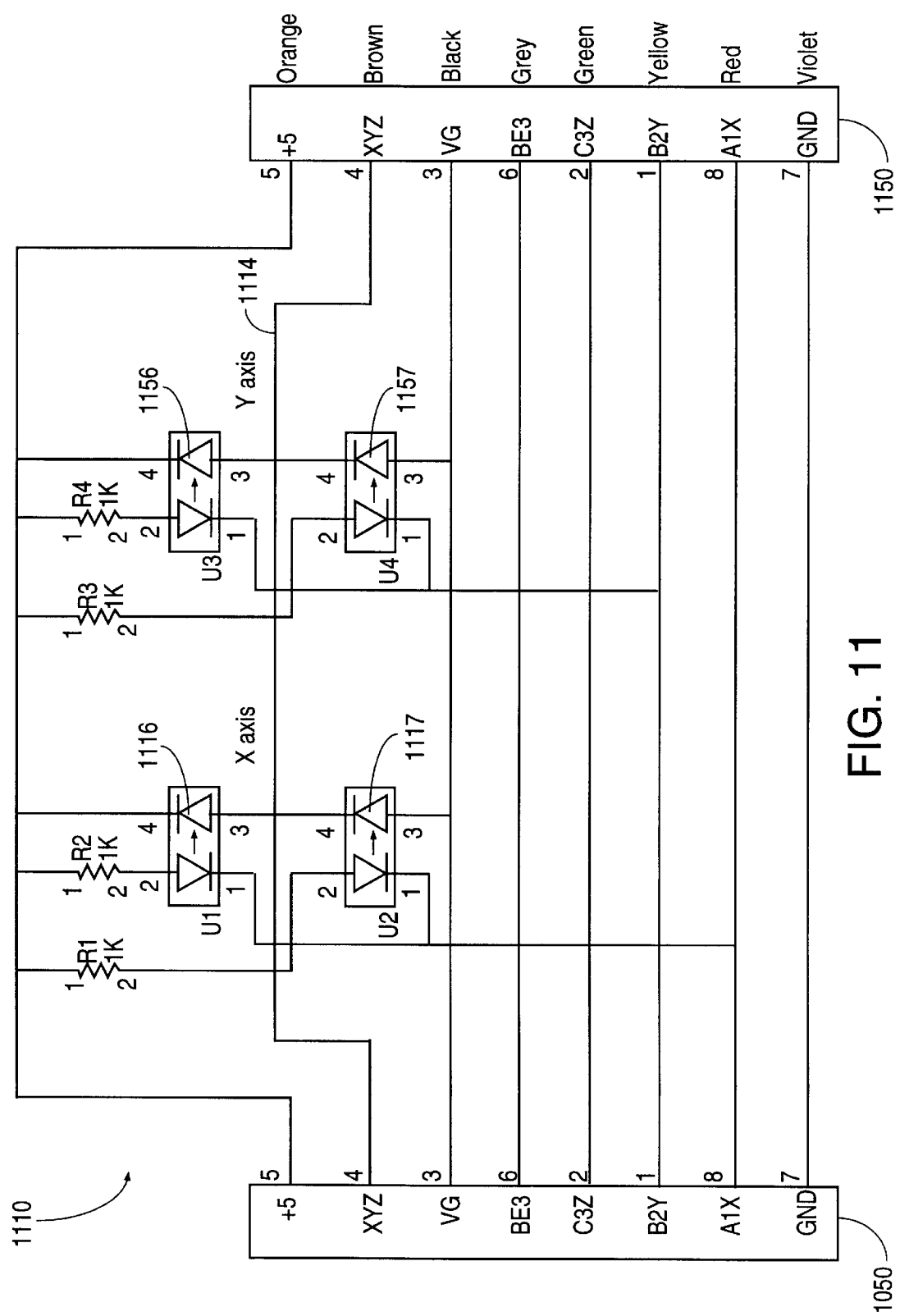
Figure 12:
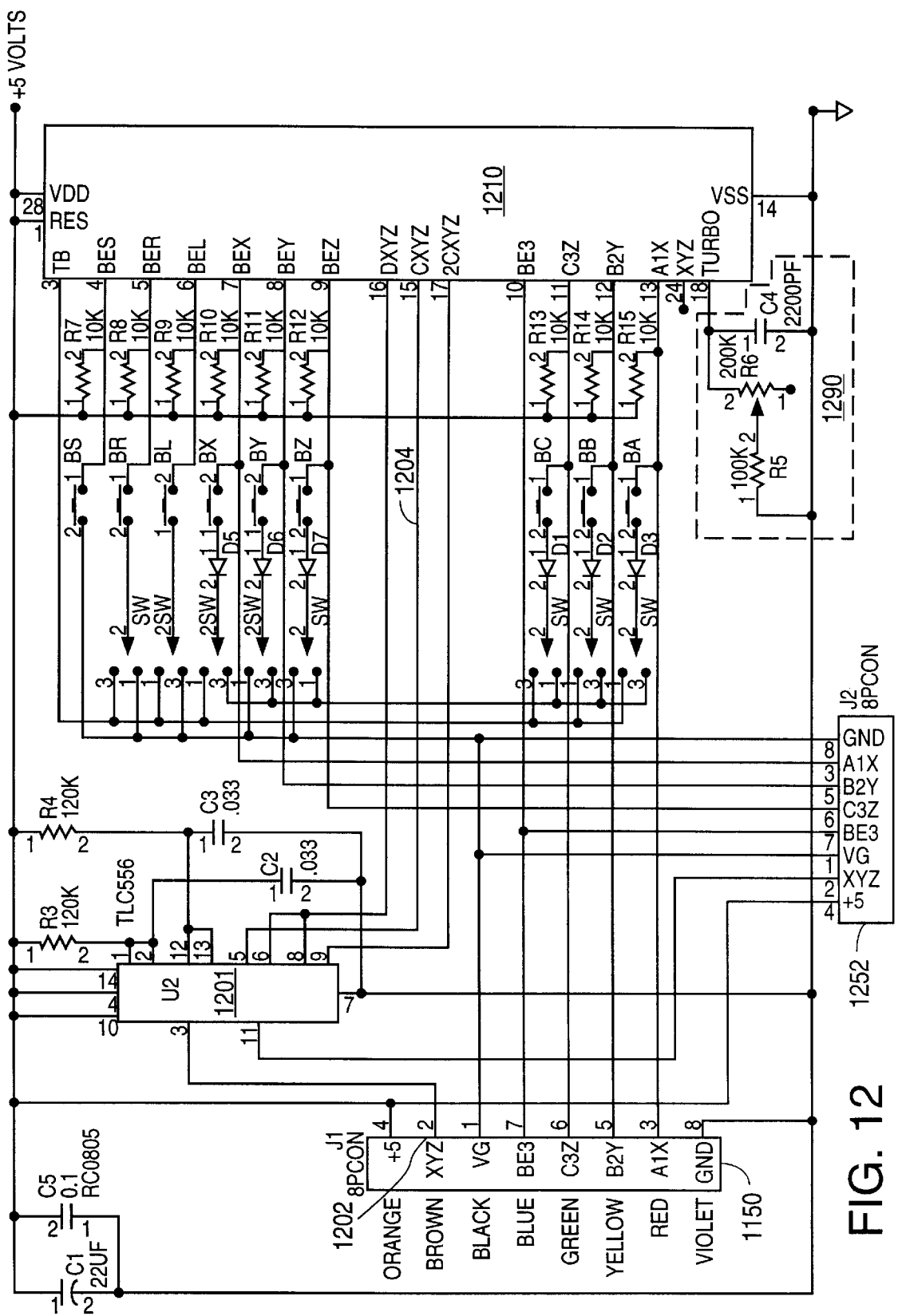

In one embodiment, the cathode of photodiode 116 is connected to the anode of photodiode 117 as illustrated in FIGS. 10, 11 and 12, to produce a voltage, henceforth "ratiometric voltage" at the junction between the two photodiodes as described briefly below in reference to FIGS. 10 to 12 and described in detail in concurrently filed, commonly owned, U.S. Pat. No. 5,560,608 application Ser. No. 08/359, 306 "Method and Apparatus for Generating Ratiometric Control Signals" by Peter M. Redford and Donald S. Stern that was incorporated by reference above.

Figure 2A:
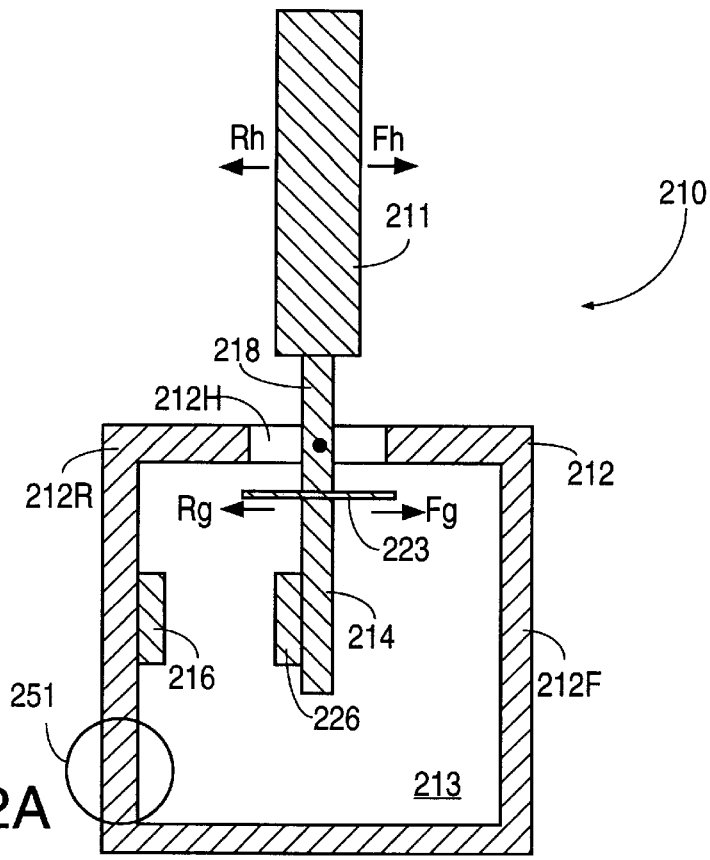
FIGS. 2A, 2B and 2C illustrate in cross-sectional side view three variations of a controller.

Although controller 110 illustrated in FIGS. 1B and 1C has two photodiodes 116 and 117, a controller, such as controller 210 (FIG. 2A) can have just one photodiode 216. In controller 210, optical gate 214 is formed as an integral portion of lever 218.

Controller 210 operates similar to controller 110 described above. Specifically, in response to moving handle 211, for example in direction Fh, lever 218 moves optical gate 214, on which is mounted LED 226, in direction Rg closer to photodiode 216 that is mounted on rear wall 212R of housing 212, thereby increasing the amount of light received by photodiode 216 and hence increasing the current supplied by photodiode 216 as compared to the current in a neutral position of handle 211. Similarly, in response to moving handle 211 in direction Rh, optical gate 214 moves LED 226 in direction Fg, farther away from photodiode 216 thereby decreasing the amount of light received by photodiode 216 and hence decreasing the current generated by photodiode 216 as compared to the current in a neutral position of handle 211. Controller 210 has the advantage of fewer optical position sensing parts than controller 110, and hence is cheaper.

A user can change the resistance of a conventional potentiometer 251, to supply a current equal to the current generated by photodiode 216 as indicated by a display device (not shown in FIG. 2A), to thereby define a position signal from controller 210 with respect to the neutral position of lever 218. A user can change the resistance of potentiometer 251 by, for example turning a rotary wiper (not shown) or moving a sliding wiper (not shown).

Figure 9:
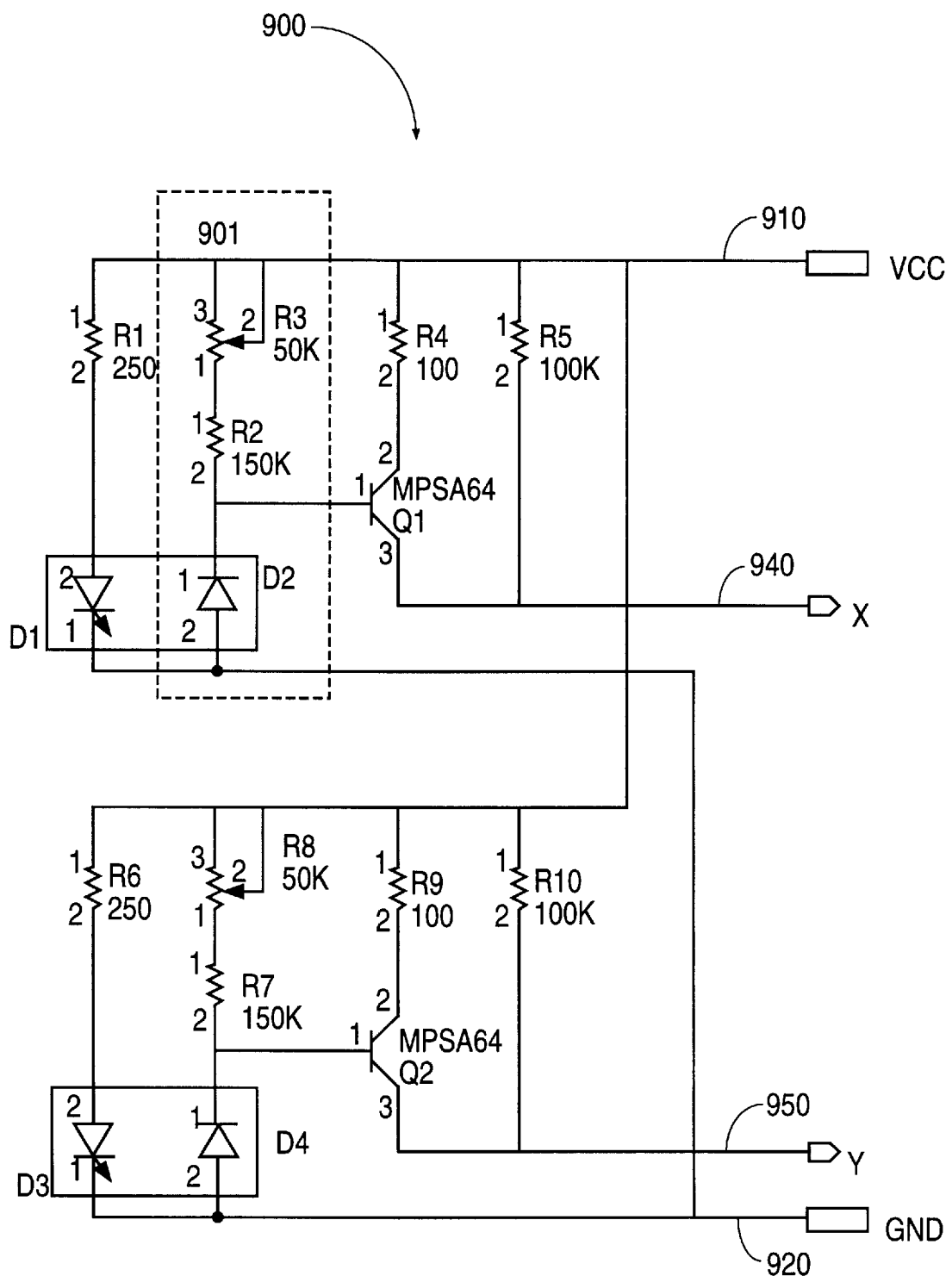
FIGS. 9 to 12 illustrate variations of electrical circuitry for connecting one or more photodiodes of a controller with other circuitry in the controller.

A circuit for using photodiode 216 and potentiometer 251 to generate a position signal is described briefly below in reference to FIG. 9 and is described in detail in the concurrently filed U.S. Pat. No. 5,650,608 application Ser. No. 08/359,306 referenced above.

Photodiode 216 can be completely shielded from direct ambient light and reasonably well shielded (for example greater than 90%) from indirect ambient light to ensure proper operation of controller 210. Controller 210 includes an optical shield in the form of a disc 223 that is typically formed of opaque plastic. Disc 223 prevents any direct ambient light that passes through hole 212H from reaching various optical position sensing parts, such as photodiode 216. The interior of housing 212 can be painted black to absorb reflected unwanted light. One advantage of controller 210 is that any dust that enters through hole 212H in housing 212 does not affect photodiode 216 or LED 226, in contrast for example, the effect of dust on LED 125 (FIG. 1C).

Figure 2B:
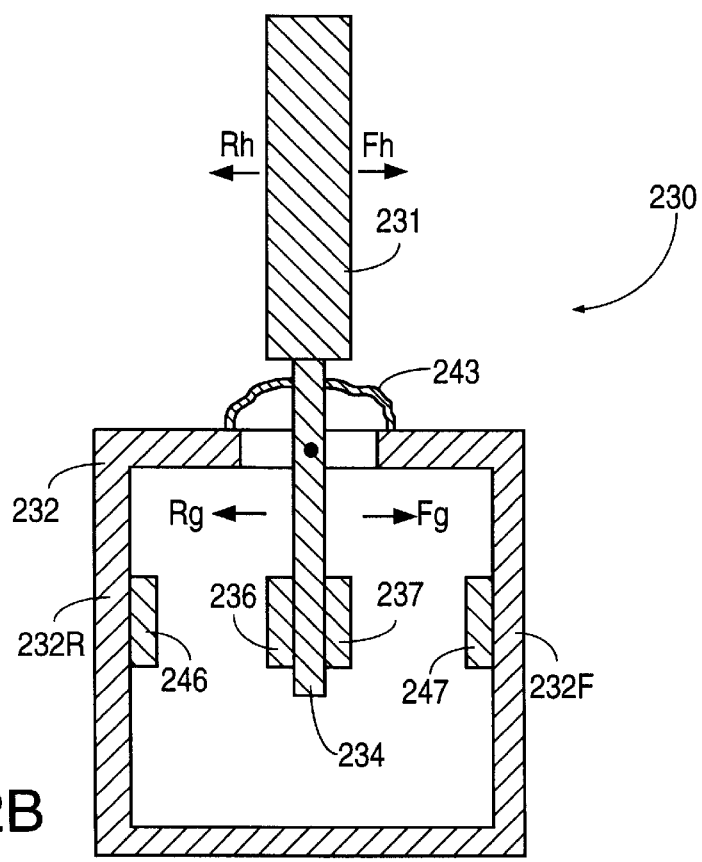

Controller 230 (FIG. 2B) has structure and operation similar to controller 110, except that photodiodes 236 and 237 are both mounted on optical gate 234 and light emitting diodes 247 and 246 are mounted on front wall 232F and rear wall 232R respectively of housing 232. In response to moving handle 231, for example in direction Fh, optical gate 234 moves photodiodes 236 and 237 in direction Rg, closer to LED 246 and away from LED 247 thereby increasing the light incident on and hence the current supplied by photodiode 236 while simultaneously decreasing the light incident on and hence the current supplied by photodiode 237.

When photodiodes 236 and 237 are connected in a ratiometric sensor, for example as described in reference to FIGS. 10, 11 and 12, controller 230 is more sensitive than controller 210, for an equal angle θ of handles 231 and 211 respectively from a neutral position. With such a ratiometric sensor, controller 230 also has greater range and greater noise immunity than controller 210.

In controller 230 (FIG. 2B), the optical shield is in the form of a flexible, opaque boot 243 that is typically made of rubber, plastic or leather. Boot 243 reduces the effects of ambient light, dust and corrosion that typically reduce the life of conventional potentiometric devices.

Numerous variations in a controller are possible, for example by changing or exchanging the location of various position sensing parts, e.g. a photodiode, an LED or an optical gate.

For example, controller 250 (FIG. 2C) includes light emitting diodes 266 and 267 as well as photodiodes 256 and 257 mounted on walls 252R and 252F of housing 252. Optical gate 254 has a first reflective surface 254R and a second reflective surface 254F that can reflect different amounts of light from LEDs 266 and 267 on to respective photodiodes 256 and 257, depending on the position of optical gate 254. Optical gate 254 is made sufficiently long, so that one end of optical gate 254 is close to floor 252B, to ensure that the majority of light from a light emitting diode, henceforth "LED", such as LED 266 is prevented from reaching a photodiode located opposite to the LED, such as photodiode 257, and at the same time is reasonably well received by a photodiode located adjacent to the LED, such as photodiode 256.

Figure 2C:
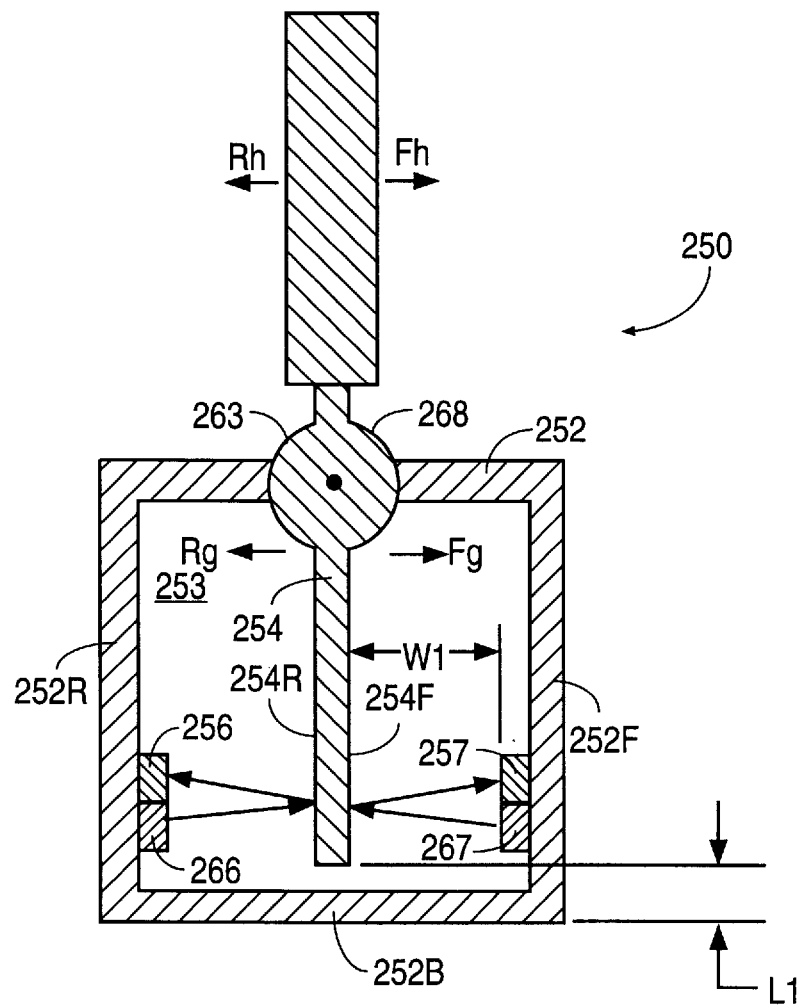

In one embodiment of the type shown in FIG. 2C, optical gate 254 is at a distance W1 of 1.5 centimeter from LED 267 and photodiode 257, and has a clearance L1 of one millimeter from floor 252B. In such an embodiment, light emitting diode 266 and photodiode 256 are mounted very close to or touching each other, to maximize the amount of light incident on photodiode 256. Similarly, photodiode 257 and light emitting diode 267 are mounted very close to or touching each other.

In controller 250, the optical shield is in the form of a spherical ball 263 that is typically injection molded of hard opaque plastic, with a diameter that is slightly smaller (for example, one millimeter smaller) than the diameter of the hole in housing 252. Ball 263 is rotatably attached to a pivot rod 268 that is fixedly attached to housing 252. Ball 263 acts as a rotating plug to keep ambient light and dust out of enclosure 253.

As compared to other controllers (such as controller 230 of FIG. 2B), controller 250 (FIG. 2C) has the additional advantage of no electrical connections to a movable part; all electrical connections and circuitry in controller 250 are mounted on housing 252. Electrical connections that are subject to movement, for example a connection to LED 226 from housing 212, can fail due to metal fatigue from repeated movement of handle 211. Therefore controller 250 has greater reliability than controller 210.

One variation of controller 250 includes LED 266 (FIG. 2C) and photodiode 256 but does not include photodiode 257 and LED 267. In such a variation, photodiode 256 supplies a position signal to, for example a personal computer's game port.

Figure 2D:
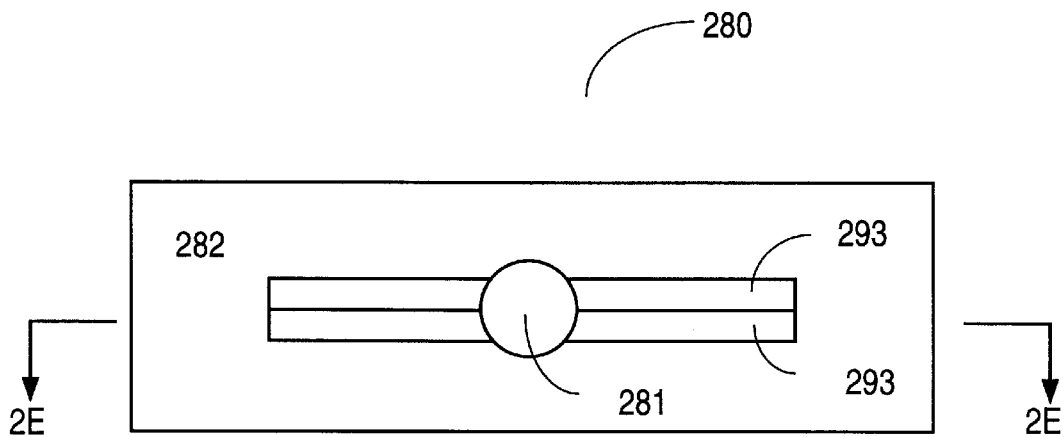
FIGS. 2D and 2E illustrate, in plan and cross-sectional side view, a controller having a dual lens light emitting diode as the light source.
Figure 2E:
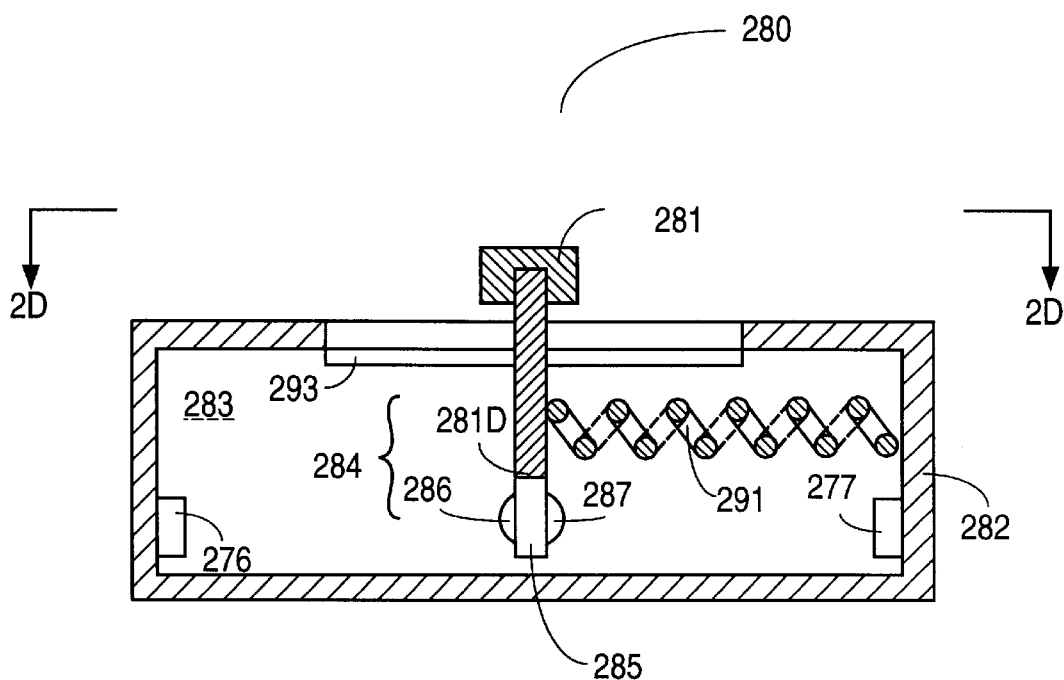

In another controller 280 (FIG. 2D), a movable element takes the form of a sliding adjuster, such as a balance slider 281 that is constrained to only sliding motion on a rail (not shown) in housing 282 that can be part of an entertainment system, such as a stereo system (not shown). Optical gate 284 includes a dual lens LED 285 having a first lens 286 and a second lens 287 opposite to each other. Dual lens LED 285 is attached to balance slider 281 at distal end 281D that is enclosed in enclosure 283. First lens 286 is located opposite to photodiode 276 and second lens 287 is located opposite to photodiode 277. An optical shield in the form of a flexible membrane 293, typically cloth with a split in the center, shields optical position sensing parts in enclosure 283 from direct ambient light.

Photodiodes 276 and 277 operate with movement of dual lens LED 285 similar to operation of photodiodes 116 and 117 (FIGS. 1B and 1C). In one embodiment, dual lens LED 285 is a GL453 available from Sharp Corporation, 1980 Zanker Road, San Jose, Calif. 95122. One advantage of a dual lens LED 285 is that controller 280 has fewer parts that need to be assembled. Moreover, alignment of first lens 286 with second lens 287 is done automatically when dual lens LED is manufactured (as a single unit). A controller with a sliding adjuster, such as balance slider 281, has the advantage of allowing a person to see the position of the sliding adjuster from a distance.

A movable element, such as a rotary adjuster, a tilt adjuster or a sliding adjuster, can be spring loaded so that the movable element returns to the neutral position when released by a user. Such a spring loaded movable element can be used for example (1) to provide relative cursor movement over a large range of total cursor movement or (2) to get faster cursor movement at extreme positions of the movable element, as compared to positions of the movable element near the neutral position. Controller 280 includes a spring 291 that returns sliding adjuster 281 to the neutral position, when sliding adjuster 281 is released by a user.

Figure 3A:
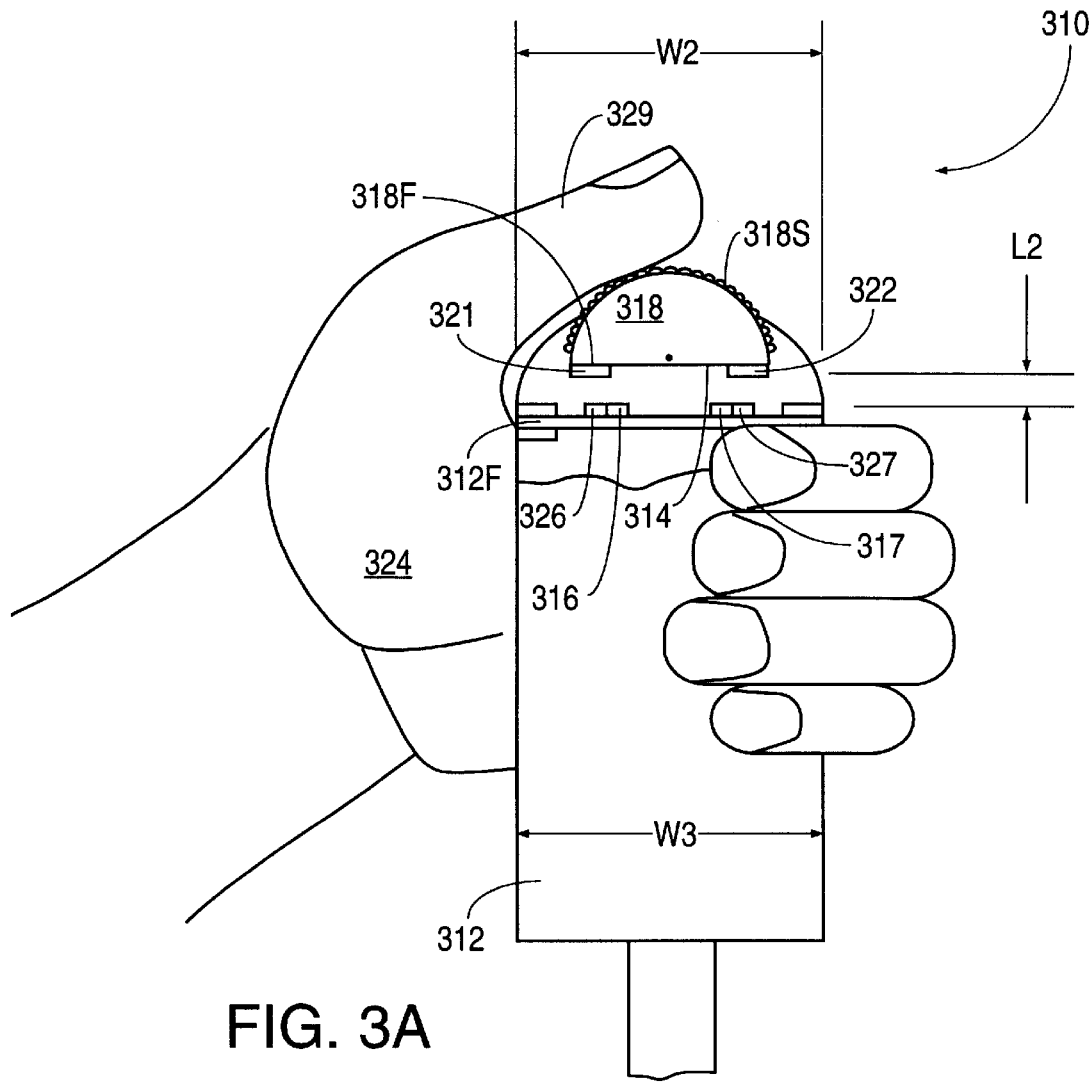
FIG. 3A illustrates a perspective view with a cut-away section showing a controller with a housing shaped as a handle.
Figure 3B:
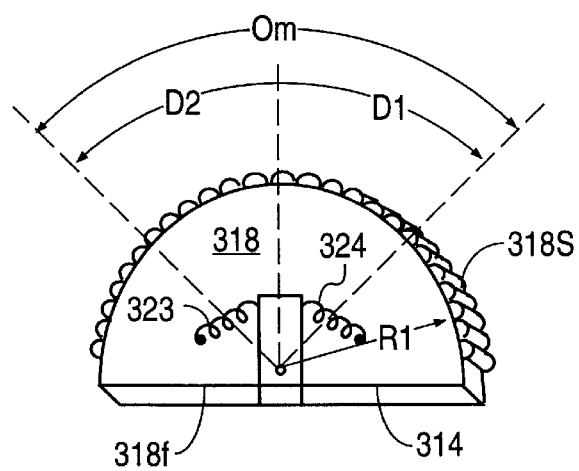
FIG. 3B illustrates springs that return the thumbwheel of the controller of FIG. 3A to a neutral position when released by a user.

Another controller 310 (FIG. 3A) that operates similar to controller 110, has housing 312 that is formed as part of a handle, such as handle 111 (FIG. 1A). Controller 310 includes a thumbwheel 318, that is rotatable, for example by a thumb 329, with respect to housing 312. Thumbwheel 318 has an approximately semicircular knurled, peripheral portion 318S (FIG. 3B) with a radius R1 (in one embodiment R1 is one centimeter) that forms a movable element in the form of a rotary adjuster. Thumbwheel 318 also has a linear peripheral portion 318F that forms an optical gate 314 (FIGS. 3A and 3B).

Thumbwheel 318 can be rotated by a maximum angle θm/2 (in one embodiment θm/2=30°) in each direction D1 or D2 from the neutral position. As thumbwheel 318 is rotated, for example in the clockwise direction, optical gate 314 (i.e. portion 318F) tilts with respect to a floor 312F that is formed by a printed circuit board, to increase the amount of light reflected by optical gate 314 on and so increase the current from, photodiode 317 and decrease the amount of light on, and so decrease the current from, photodiode 316. After rotation, when thumbwheel 318 is released, springs 323 and 324 (FIG. 3B) return thumbwheel 318 to a predetermined neutral position.

Optical gate 314 is optically shielded from ambient light within enclosure 313 by edges of housing 312 that are adjacent to semicircular peripheral portion 318S. Housing 312 has a width W3 while floor 312F has a width W2 that are of sizes appropriate to allow the fingers of a human hand 324 to wrap around housing 312 and allow thumb 329 to move peripheral portion 318S. In one embodiment, width W3 is four centimeters and width W2 is three and one-half centimeters.

LED 326 and photodiode 316 are mounted on floor 312F adjacent to one end of optical gate 314 while photodiode 317 and LED 327 are mounted on floor 312F opposite to the other end of optical gate 314. In one embodiment, LEDs 326 and 327 are machine mounted next to respective photodiodes 316 and 317 precisely to approximately one thousandths of an inch, to ensure an approximately matching signal from both photodiodes, when thumbwheel 318 is in a neutral position.

In one embodiment, the packages of LEDs 326 and 327 are made of an opaque packaging material, such as opaque plastic, to prevent crosstalk, i.e. leakage of light from an LED to an adjacent photodiode through a side of the package. Use of an opaque packaging material for LEDs allows greater tolerance in the mounting of LEDs and photodiodes. An LED packaged in a transparent packaging material can also be used with an optical shield (not shown) located between the LED and an adjacent photodiode to prevent crosstalk.

If light were to leak from an LED to an adjacent photodiode, such light leakage affects the signal generated by the photodiode. Such a cross-talk effect caused by one LED can be countered if a similar cross-talk effect is created in an opposite photodiode by another LED, when the two photodiodes are connected to form a ratiometric sensor.

In one variation of controller 310, reflectors 321 and 322 are mounted on optical gate 314 to ensure reflection of light from LEDs 326 and 327 on photodiodes 316 and 317 respectively.

Figure 3C:
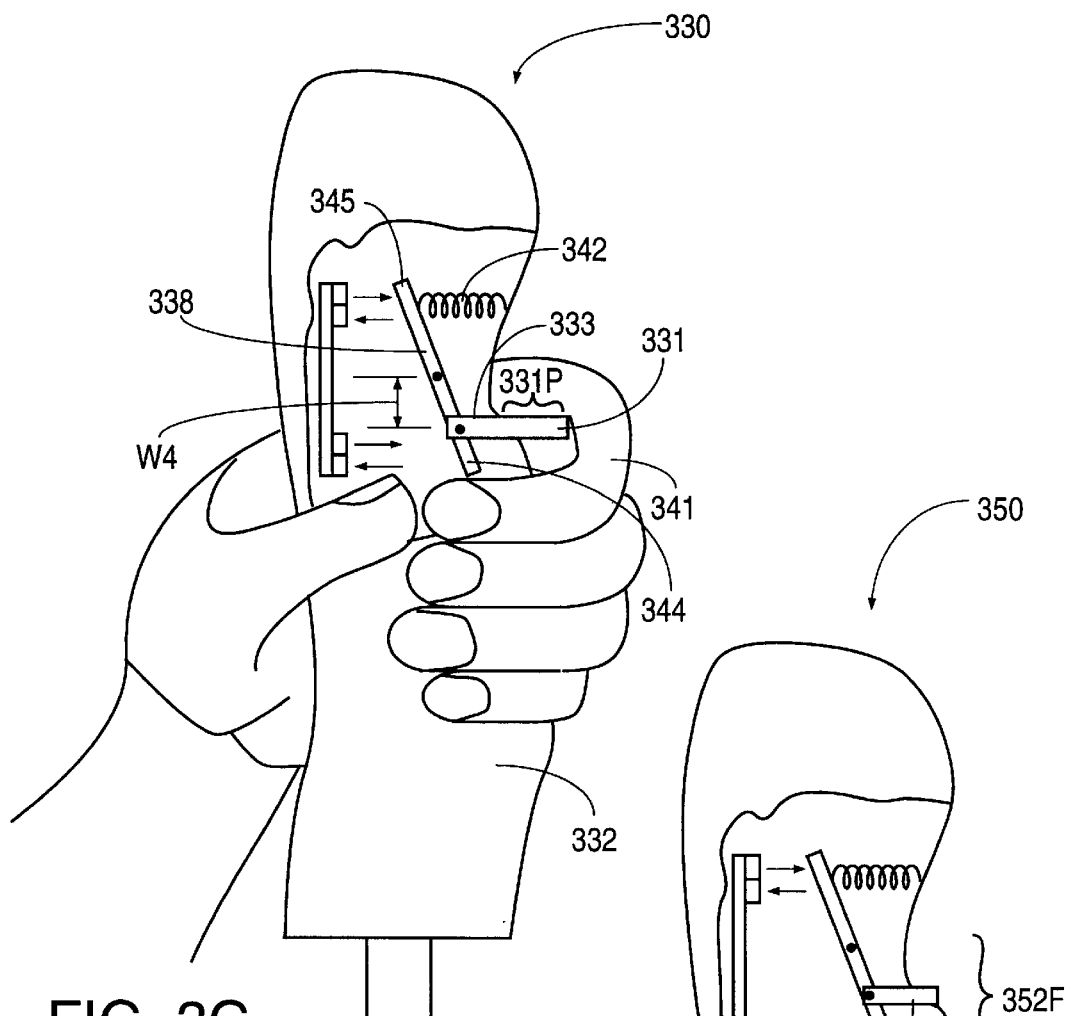
FIGS. 3C and 3D illustrate two variations of a controller included in a handle that has a trigger or a flexible portion respectively as the movable element.

Another controller 330 (FIG. 3C) is similar to controller 310 except that the movable element is formed as a trigger 331 that pivots at a distance W4 (of 0.5 centimeter in one embodiment) on a first side 344 from the center of lever 338. Trigger 331 has a protruding portion 331P that protrudes outside of housing 332 through a hole 333 so that an index finger 341 of a human hand can squeeze trigger 331. In one embodiment of the type illustrated in FIG. 3C, trigger 331 is 1.5 centimeter long, of which a 0.5 centimeter portion protrudes outside of housing 332.

A spring 342 attached on a second side 345 at distance W4 from the center of lever 338 is normally in an extended state and keeps trigger 331 pushed out when no force is exerted on trigger 331. In one embodiment, spring 342 is a coiled spring that is one and one half centimeter long, 0.3 centimeter wide and formed of a steel wire of 1/16 inch diameter.

Squeezing trigger 331 moves lever 338 through a total angle θ (typically 60°) for the two extremes of trigger 331.

Figure 3D:
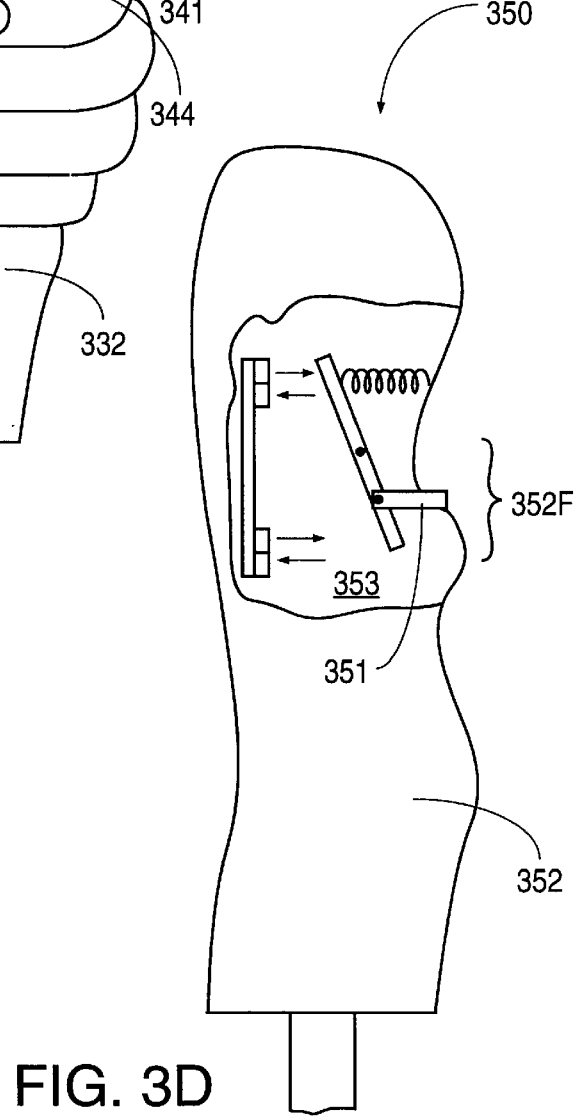

Controller 350 (FIG. 3D) is similar to controller 330 except that instead of trigger 331 protruding from housing 332, trigger 351 is mounted underneath but in contact with a (and in one embodiment attached to) flexible portion 352F of housing 352. Flexible portion 352F forms the movable element of controller 350 and yet allows enclosure 353 in housing 352 to be completely sealed from all ambient light, dust and moisture.

Figure 3E:
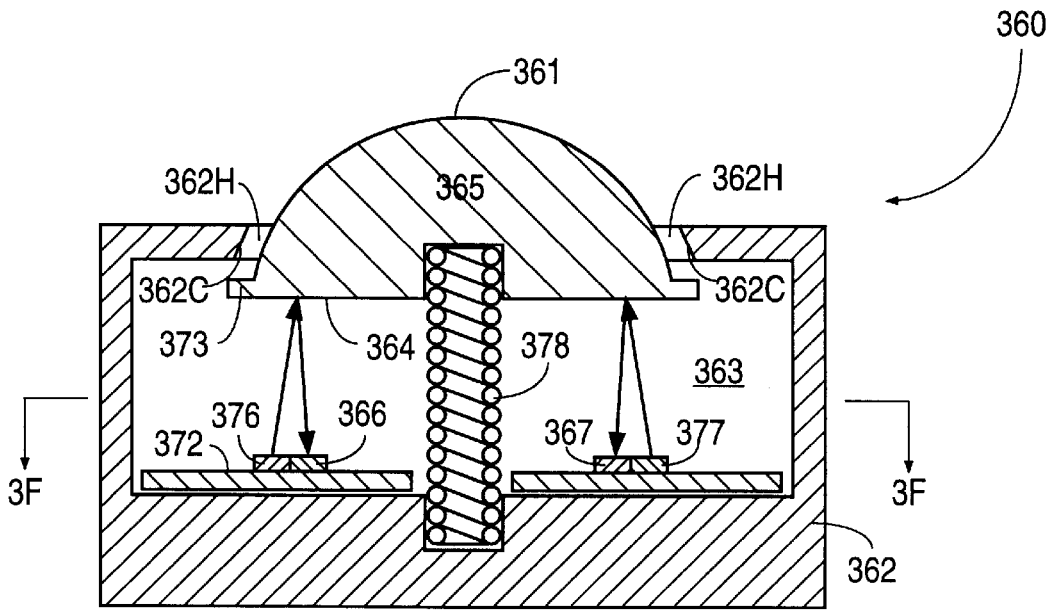
FIGS. 3E and 3F, 3G and 3H illustrate side view and topview respectively of two variations of a controller that includes a hemispherical solid shaped trackball as a moving element.
Figure 3F:
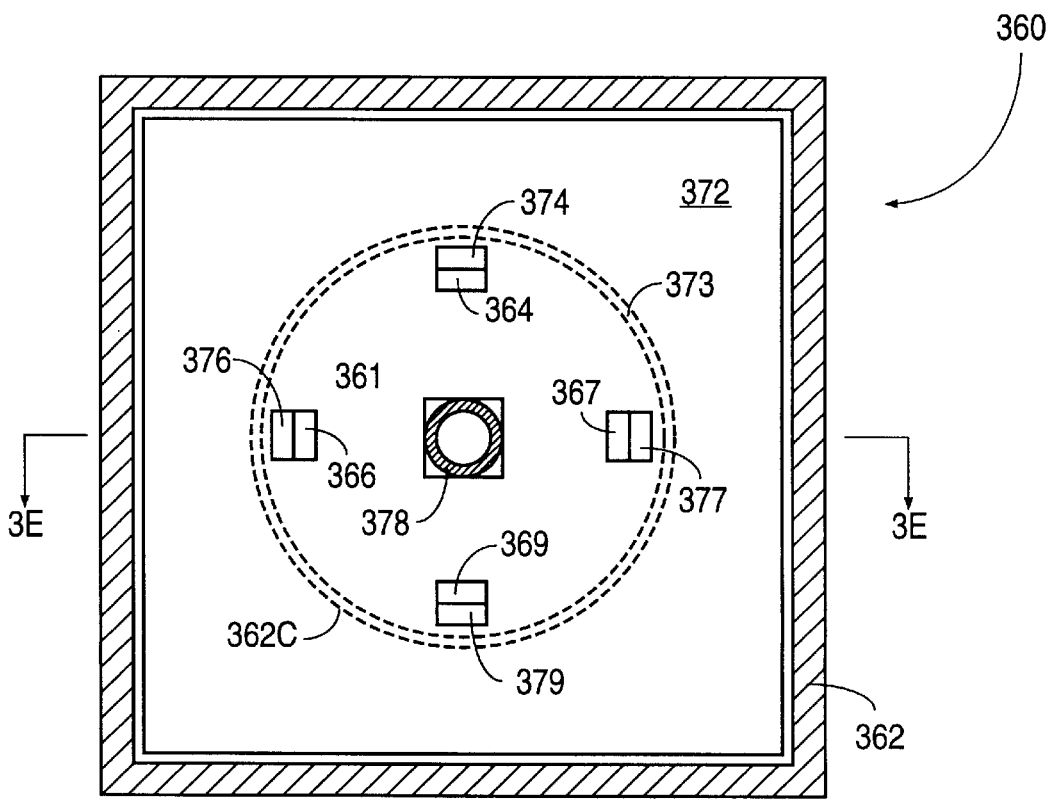

Controller 360 (FIGS. 3E and 3F) has a structure similar to controller 310 (FIG. 3A), except that instead of a thumbwheel 318 (FIG. 3A), controller 360 has a trackball 365 that has a hemispherical surface 361 as a movable element in the form of a tilt adjuster that is only capable of tilt motion (similar to tilt motion of a joystick). Hemispherical surface 361 is exposed outside of housing 362 through a hole 362H defined by a conforming surface 362C of housing 362, to allow a user to roll trackball 365 and thereby tilt optical gate 364, that is formed as an approximately flat surface of trackball 365, with respect to two or more of photodiodes 366, 367, 364 and 369 and LEDs 376, 374, 377 and 379, thereby changing the currents supplied by the respective photodiodes, in a manner similar to that described above for controller 310.

Conforming surface 362C and hemispherical surface 361 are parallel to each other but do not touch each other when track ball 365 is in a neutral position. Spring 378 holds track ball 365 very close to housing 362 (in one embodiment with a clearance of 1 millimeter between conforming surface 362C and hemispherical surface 361), so that housing 362 and track ball 365 do not touch each other.

Controller 360 has a very low profile due to the hemispherical solid shape of trackball 365, as compared to the profile of trackball based conventional controllers because conventional controllers use: (a) a complete spherical solid as a trackball and (b) use other bulky devices, such as mechanical quadrature encoders that are driven by mechanical gears.

Another advantage of controller 360 is that the smooth hemispherical surface 361 provides a nicer feel to a user, as compared to the feel provided by, for example a joystick. Moreover, controller 360 can be made to fit within the confines of the housing of a conventional television remote control.

When the photodiodes of controller 360 are connected in a ratiometric sensor of the type described below, controller 360 can provide a larger dynamic range of movement of trackball 365, as compared to a conventional controller based on force sensing resistors, which conventional controller can be, for example the controller built into the keyboard of an IBM PC Thinkpad Model No. 755, available from IBM Corporation, Boca Raton, Fla.

Figure 3G:
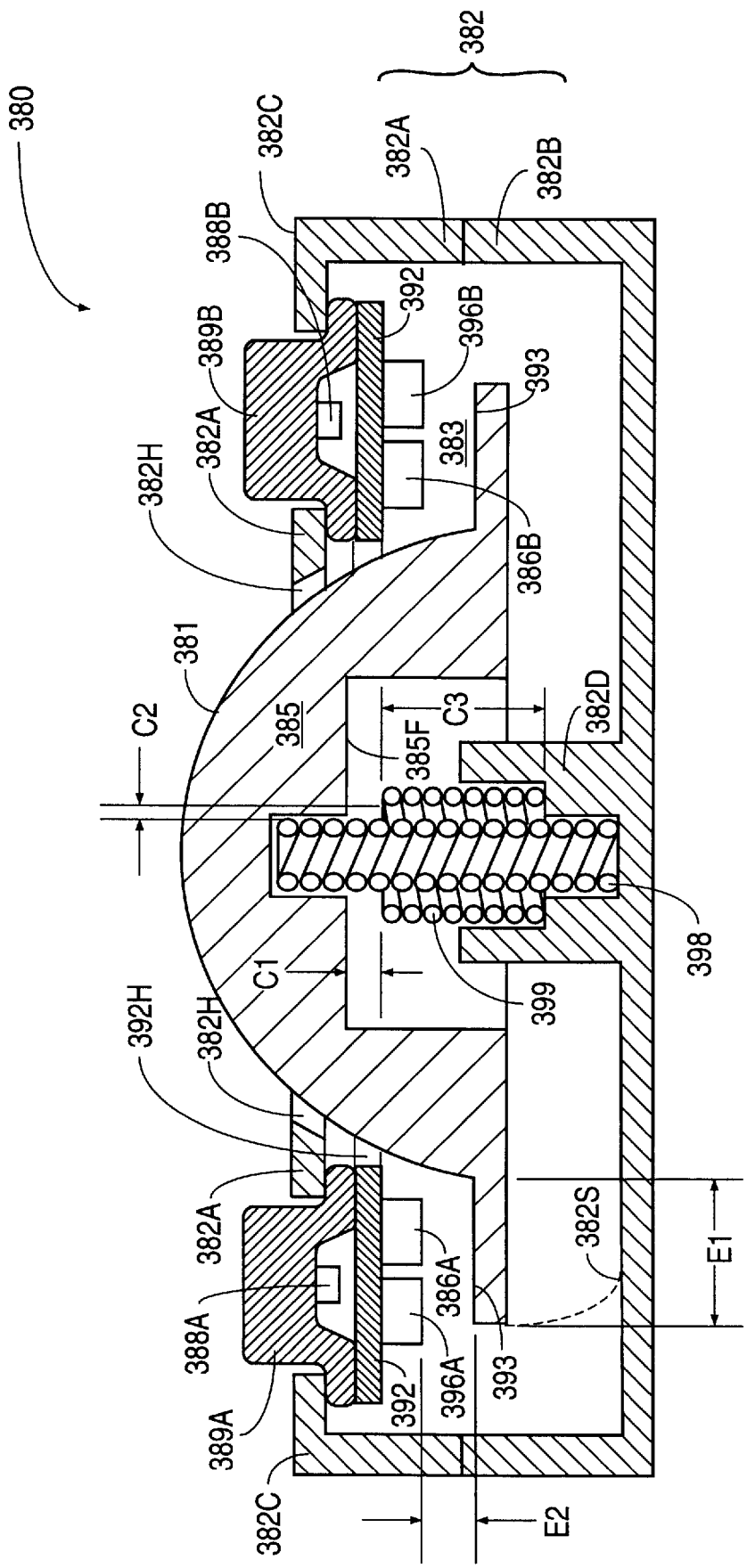
Figure 3H:
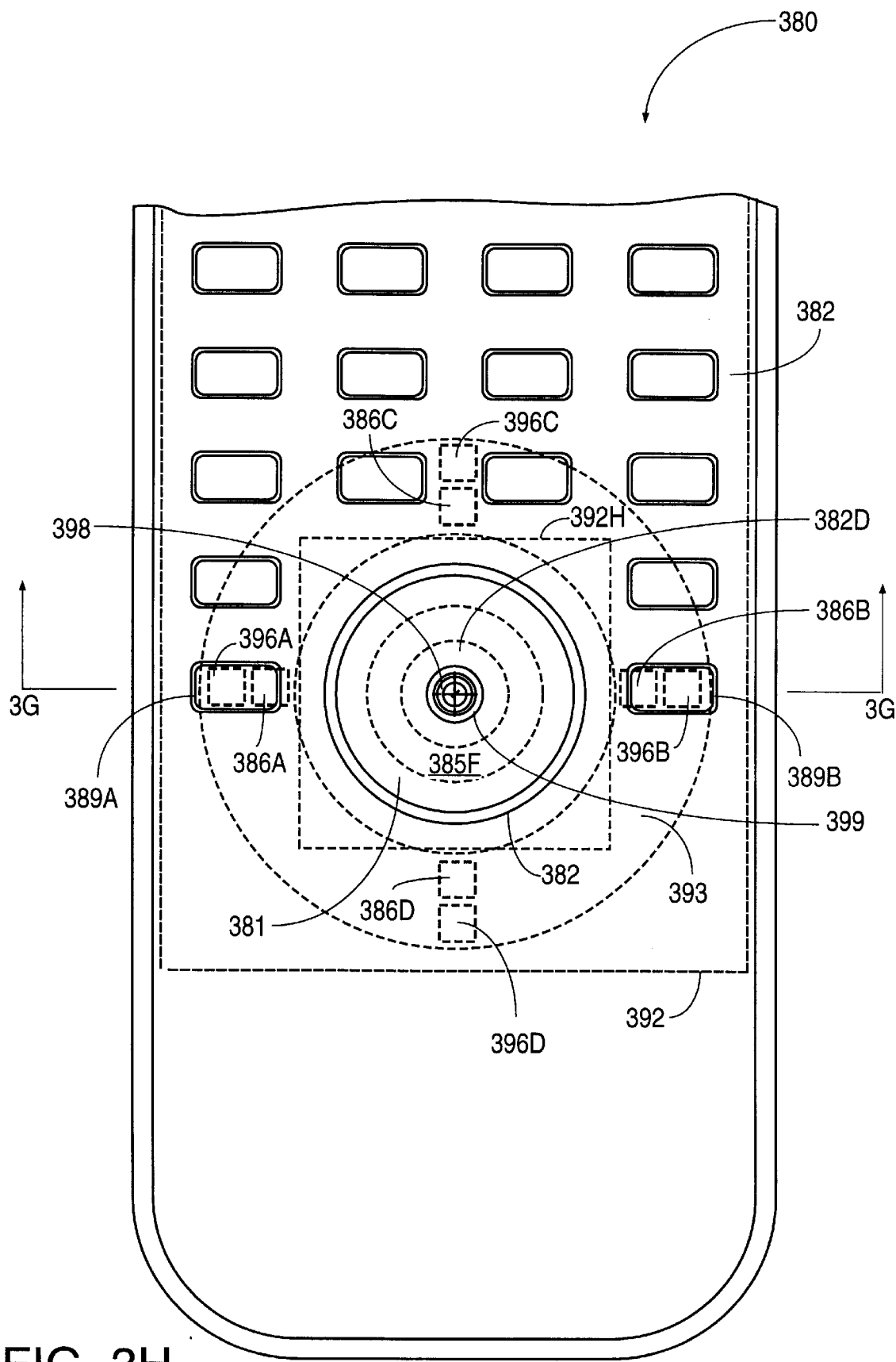

Controller 380 (FIGS. 3G and 3H) is structurally and operationally similar to controller 360 (FIGS. 3E and 3F) except for the following differences. While printed circuit board 372 (FIG. 3E) of controller 360 is mounted opposite to trackball 365, printed circuit board 392 (FIG. 3G) of controller 380 is mounted adjacent to trackball 385 to allow buttons, such as buttons 389A, 389B with conductive contacts 388A, 388B to be mounted on printed circuit board 392,while being accessible through holes in ceiling 382C. Ceiling 382C also has a hole 382H through which hemispherical surface 281 is also accessible in the manner described above in reference to controller 360. Such a location of printed circuit board 392 results in lower cost and improved manufacturability of controller 380, as compared to, for example, controller 360. Numerous other buttons (not labeled) can be supported by housing 382 as shown in FIG. 3H, and used for example as switch SW or one of switches A to C illustrated in FIGS. 12 and 10 respectively.

Moreover, controller 380 has a two springs 398 and 399, that are: (a) mounted in a boot 382D in enclosure 383, (b) concentric with each other at a distance C2 (FIG. 3G) from each other, (c) connected to circuitry (not shown in FIGS. 3G and 3H) of printed circuit board 392, and (d) act as two elements of a switch (such as switch SW2 of FIG. 12) that is closed when springs 398 and 399 touch each other, for example due to a slight movement of trackball 385, such as movement through distance C2.

Spring 398 is attached to and supports trackball 385 in the manner described above in reference to controller 360. Spring 399 has a clearance C1 from a ceiling wall 385F of trackball 385, such that trackball 385 does not touch spring 399 even when trackball 385 has been tilted or rolled to a maximum possible position in controller 380.

Moreover, when trackball 385 has been tilted to a maximum possible position, for example in the counterclockwise direction, an annulus shaped lip 393 of trackball 385 touches housing 382 at for example, point 382S. In such a position, lip 393 prevents any further counterclockwise movement of trackball 385 and thus acts as a stop to prevent the opposite side of lip 393 from touching an LED, such as LED 396B. Lip 393 has an annular reflective surface of width E1 that is sufficiently large and acts as an optical gate that reflects light from LEDs 396A to 396D to photodiodes 386A to 386D, respectively (FIG. 3H) even when trackball 385 is in a maximum possible position. In one specific embodiment, length C3 of spring 399 is 0.6 centimeters, both clearances C1 and C2 are one millimeter each, and distances E1 and E2 are 10 millimeters.

Controller 380 has the advantage of immunity to dust because any dust that falls through hole 382H of housing 382 falls on lip 393, so that the dust does not affect the operation of LED 396 or photodiode 386 unlike, for example, the interference due to location of dust on photodiodes 366 and 367 in controller 360.

Another advantage is that controller 380 can use the switch formed by springs 398 and 399 to turn on a power supply. For example LEDs 396A to 396D and photodiodes 386A to 386D can be turned on only when trackball 385 is at a distance greater than distance C2 from the neutral position and otherwise left turned off. Such a switch conserves valuable battery power, for example when trackball 385 is in the neutral position.

Figure 4A:
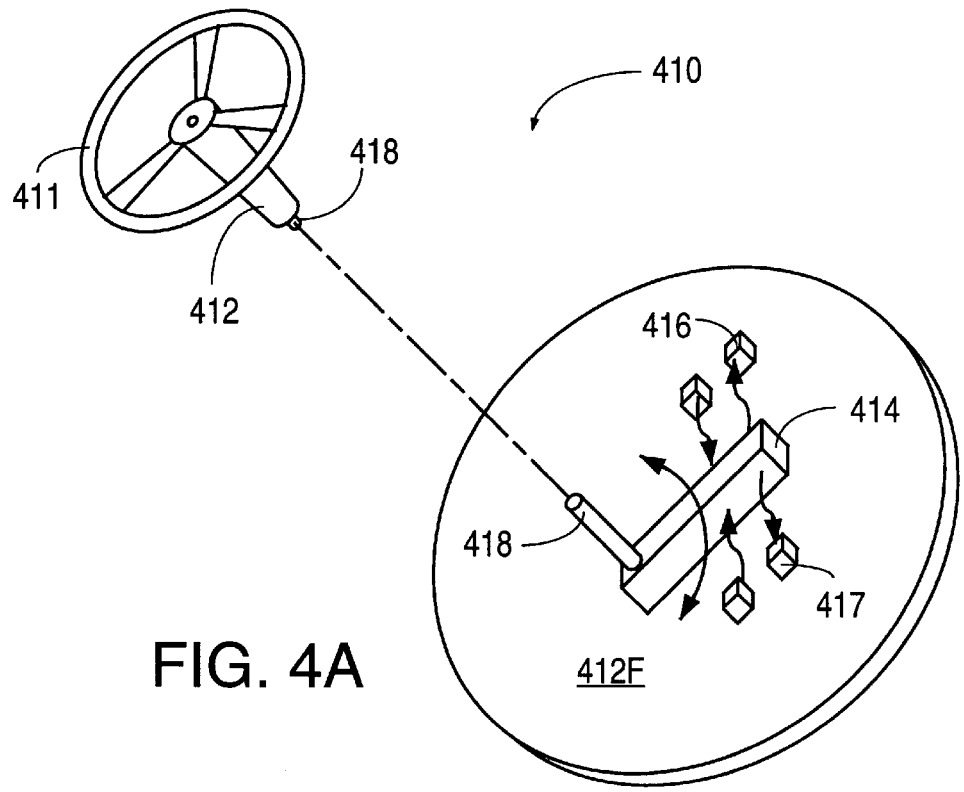
FIGS. 4A and 4B illustrate two controllers that have a steering wheel as the movable element.

Another controller 410 (FIG. 4A) has a movable element in the form of a rotary adjuster, such as a steering wheel 411. In response to rotation of steering wheel 411, an axle 418 moves an optical gate 414 closer to a photodiode 416 and away from another photodiode 417 and so operates similar to controller 110. In one embodiment, all optical position sensing parts of controller 410 are enclosed within a housing formed by steering column 412 and floor 412F. Controller 410 has the advantage of providing a user with a more realistic driving experience in a racing car video game as compared to controller 110.

Controller 430 (FIG. 4B) is similar to controller 410 except that controller 430 includes a worm gear 441 that converts rotary motion of a steering wheel 431 into translation motion of an optical gate 434 located between photodiodes 436 and 437. Worm gear 441 translates several rotations of steering wheel 431 into a small translation of optical gate 434, and so allows low powered LEDs to be mounted close to optical gate 434.

Figure 4B:
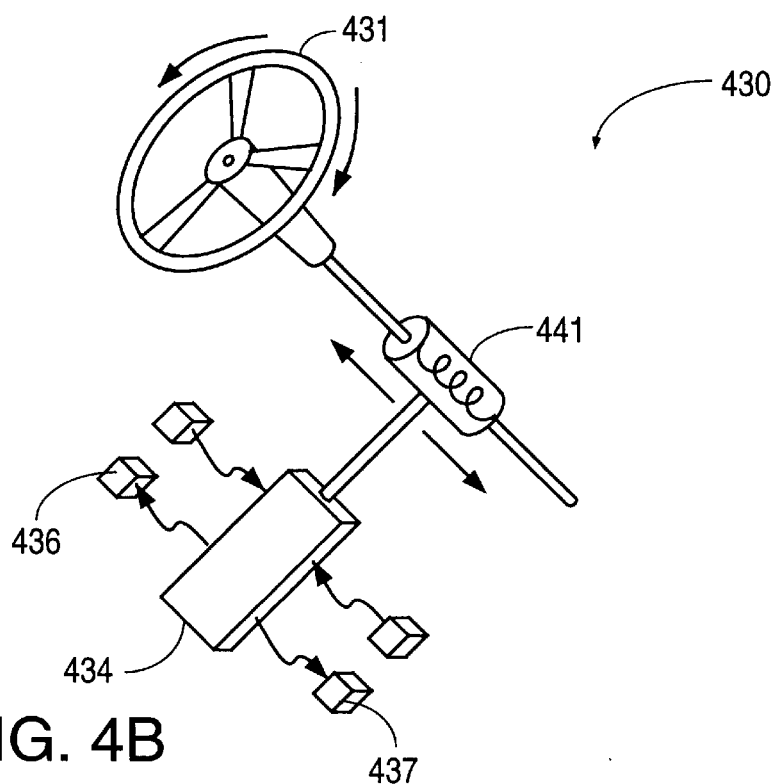
Figure 5:
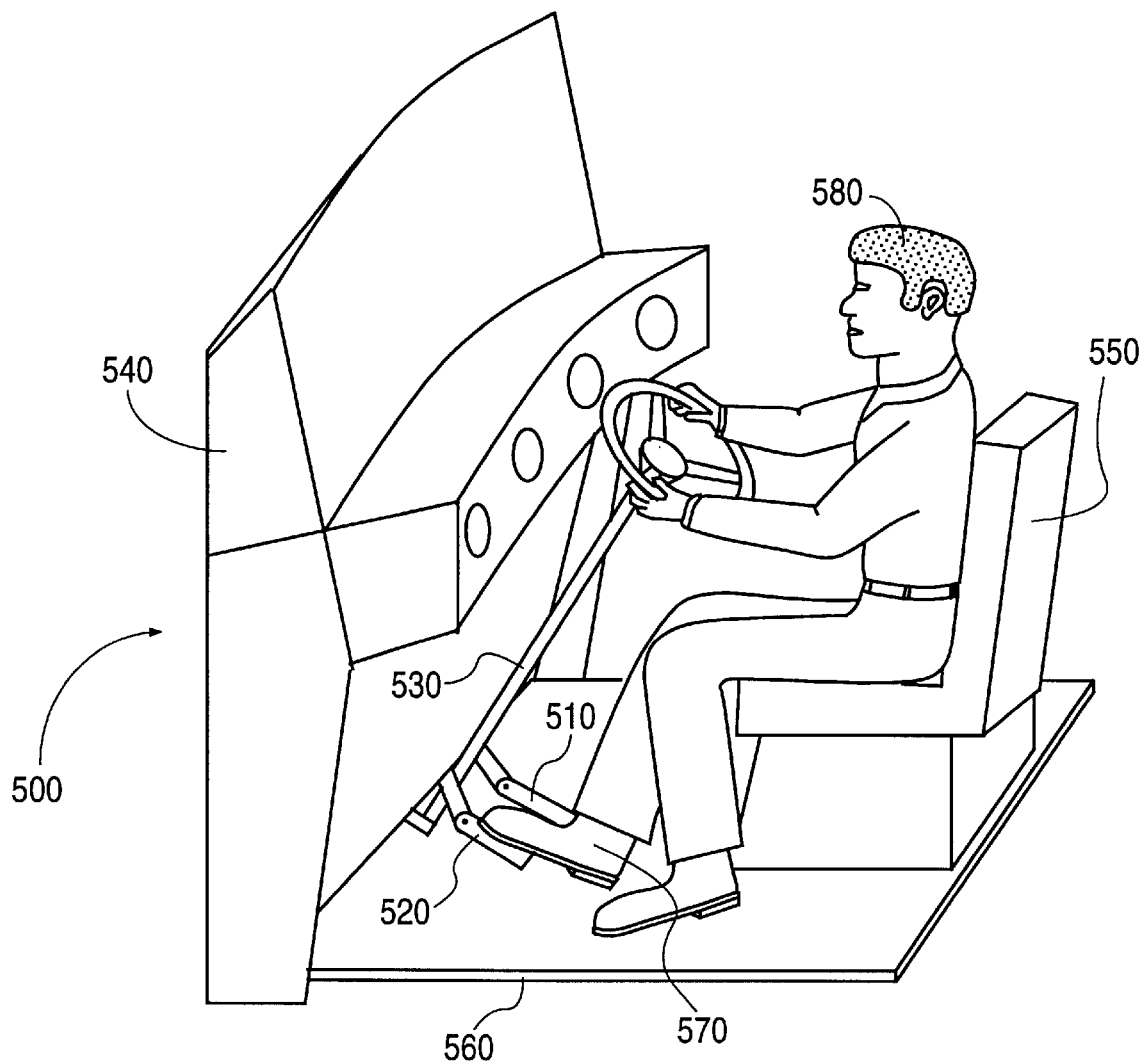
FIG. 5 illustrates a racing car simulator that includes a gas pedal controller (FIG. 3D), a brake pedal controller (FIG. 3D) and a steering wheel controller (FIG. 4A).

Various controllers described above and modifications and adaptations of the same can be used in a variety of apparatuses, such as a racing car simulator 500 (FIG. 5). Racing car simulator 500 includes a gas pedal controller 510 and a brake pedal controller 520 that are both identical to controller 350 (FIG. 3C), and also includes a steering wheel controller 530 that is identical to controller 430 (FIG. 4B).

Racing car simulator 500 includes a seat 550 that conforms to a typical seat in a sports car, for example as defined in "The Human Scale™ Seating Guide" by Henry Dreyfuss Associates (1990) which is incorporated herein in its entirety. Seat 550 can be formed of, for example fiberglass. Racing car simulator 500 displays images on a display device 540, such as a television or a rear projection screen, that is located opposite to seat 550. Gas pedal controller 510 and brake pedal controller 520 are mounted adjacent to a floor 560 between display device 540 and seat 550 for operation by a foot 570 of a person 580 seated in seat 550.

Racing car simulator 500 has the advantage of better resolution than a conventional simulator for the reasons described above. Also, racing car simulator 500 reduces static friction of a conventional simulator because none of the optical position sensing parts in simulator 500 contact each other. In racing car simulator 500, a slight turn (for example of 5°) of steering wheel controller 530 results in a proportionately slight turn of the image on display device 540, to allow a user to follow a gradual turn in a road.

Figure 6B:
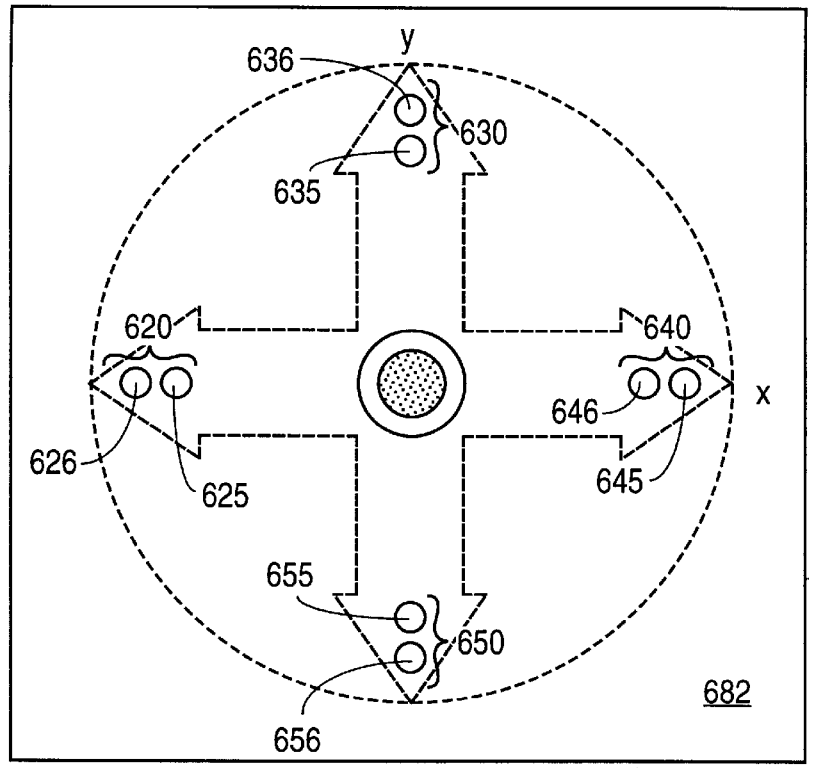
FIGS. 6B and 6C illustrate in plan view two variations in the use of LEDs and photodiodes in two controllers of the type illustrated in FIG. 6A.

Another embodiment of a controller 610 (FIG. 6A) includes a flexible member, such as rod 618 that has a distal end 618A rigidly coupled to floor 612F of housing 612. A proximal end 618B of rod 618 is coupled to optical gate 614 that is formed as an approximately flat disk. Optical gate 614 is rigidly coupled to a movable element 611 that is formed in the shape of a handle.

Controller 610 can indicate the position of movable element 611 in two axes, e.g. X and Y axes by using four sets of LEDs and photodiodes, such as sets 620, 630, 640 and 650 that are arranged at the four corners of a cross (FIG. 6B) on a printed circuit board 682 and are connected to form two ratiometric sensors of the type described below.

Rod 618 has a diameter Dr (in one embodiment 0.1 centimeter), a length Lr (in one embodiment 3 centimeters) and is formed of, for example steel or plastic. Optical gate 614 has a diameter Dg (in one embodiment 5 centimeters) and a thickness Tg (in one embodiment 0.2 centimeter). Movable element 611 has a diameter Dm (in one embodiment 2 centimeters), that is smaller than diameter Dh (in one embodiment 3.5 centimeters) of hole 612H in housing 612 to allow movable element 611 to be tilted by a maximum angle θm/2 (θm/2=30° in one embodiment) from the neutral position. Optical gate 614 and printed circuit board 682 are separated from each other by a distance Tm (in one embodiment one centimeter) that is sufficient to prevent contact between each other, when handle 611 is tilted to angle θm/2 from the neutral position.

In one embodiment, rod 618 (FIG. 6A) is made integral with housing 612 of, for example injection molded plastic. Housing 612 can be made thin and yet rigid by providing a number of ribs in floor 612F. Optical gate 614 and movable element 611 can be shrunk fit on rod 618.

Controller 610 is a frictionless device because none of the optical position sensing parts of controller 610 contact each other, when movable element 611 is tilted in any direction. Moreover, tilting of movable element 611 does not create any friction. The frictionless nature of controller 610 not only results in no maintenance and long life, but also allows a user to make extremely small changes in the position of movable element 611, due to lack of a need to overcome static friction that is present in most prior art controllers. The smallest change is limited only by the resolution of the analog to digital converter that samples the position signals from controller 610. Moreover, all electrical components of controller 610 can be surface mounted on printed circuit board 682, which reduces fabrication costs as compared to, for example, a potentiometric joystick.

In the manner noted above in reference to FIG. 2A, a controller 610 can provide a position signal along X and Y axes with only two sets of LEDs and photodiodes, such as sets 660 and 670 (FIG. 6C) located at two adjacent ends of a cross. Potentiometers (not shown) can be used in such a variation of controller 610 to allow a user to center the position signal, in the manner described above in reference to FIG. 2A.

Although a photodiode and an LED of a set, such as photodiode 625 (FIG. 6B) and LED 626 of set 620, have been shown mounted along a radial line of controller 610, which radial line passes through the center of rod 618, in another embodiment, a photodiode and an LED of a set can be mounted tangentially, for example, photodiode 625 and LED 626 can be at an identical radial distance from rod 618's center.

Figure 7A:
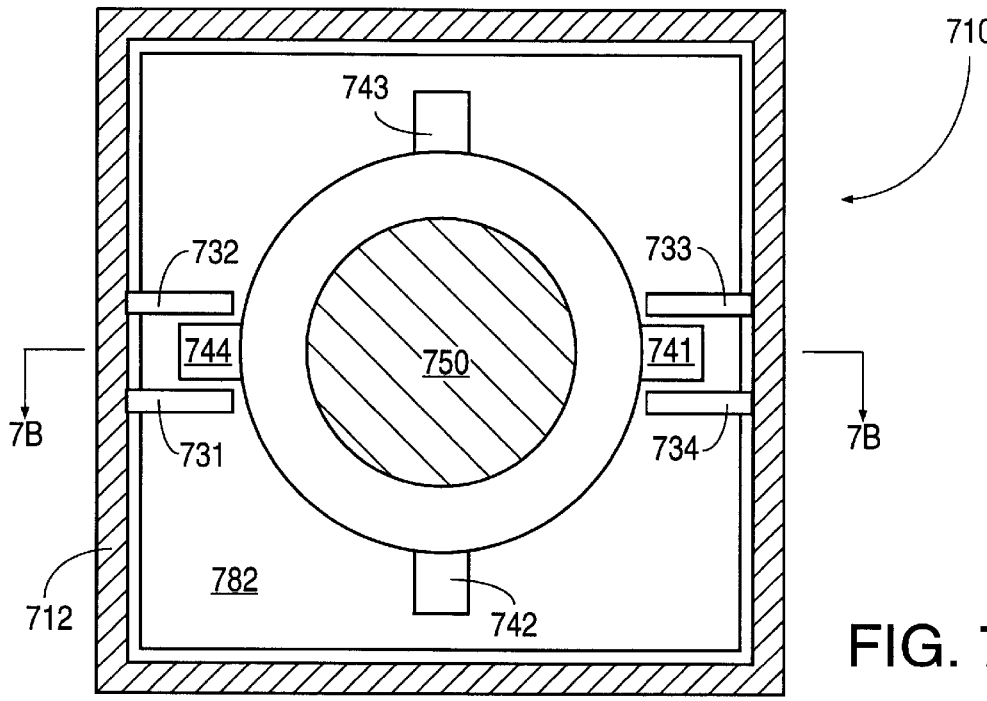
FIGS. 7A and 7B illustrate in cross-sectional plan and front views along directions 7A—7A and 7B—7B of FIGS. 7B and 7A, a controller that has a coiled spring as the flexible member.
Figure 7B:
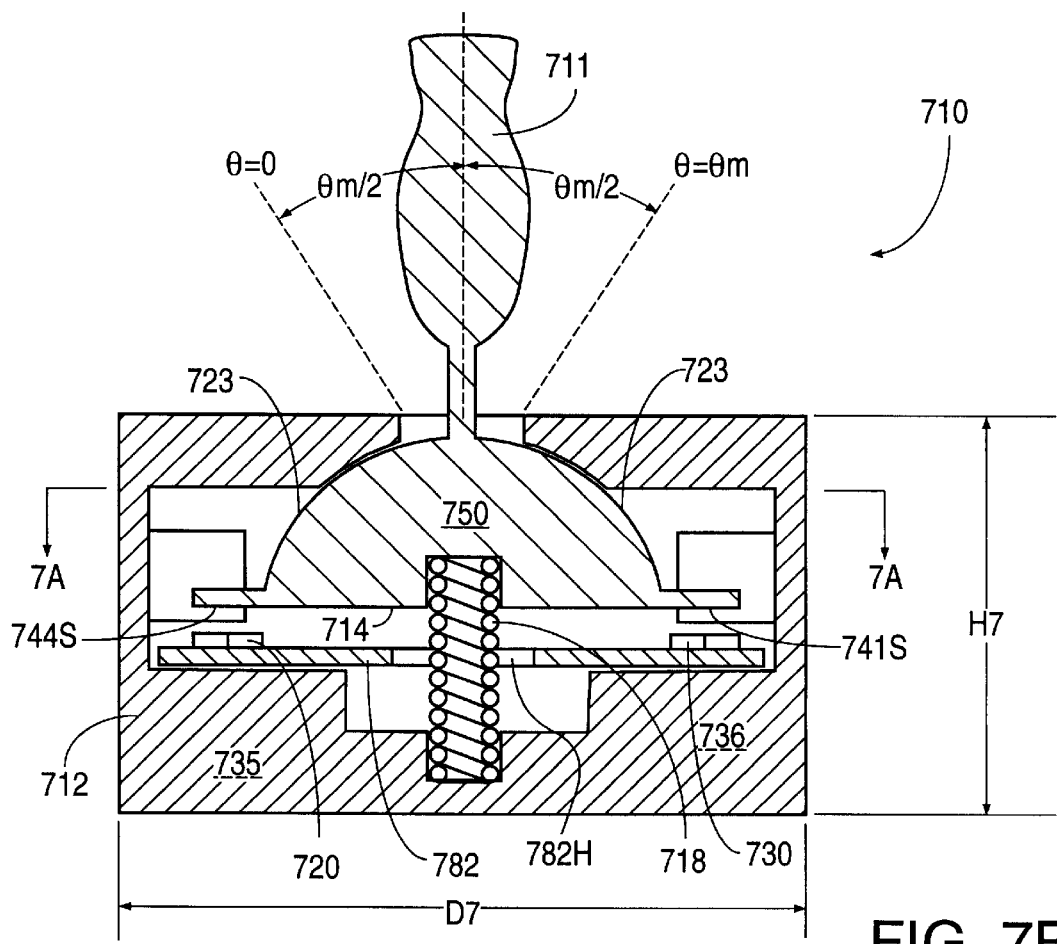

A controller 710 (FIGS. 7A and 7B) includes a coiled spring 718 (FIG. 7B) as a flexible member, and is similar to controller 610 in function and structure, except that tilting movable element 711 causes a small amount of friction between adjacent surfaces of spring 718. Coiled spring 718 is fully compressed when a moveable element in the form of handle 711 is in the neutral position.

In one specific embodiment, coiled spring 718 is typically a spring of length 31.5 mm, diameter 11.5 mm and thickness 2 mm available from American Precision Spring, Inc., 120 S. Wolfe Road, Sunnyvale, Calif.

In controller 710, optical gate 714 and optical shield 723 are formed on the surfaces of a hemispherical shaped solid 750 that has four protrusions 741 to 744. Shield 723 comprises a hemispherical surface, whereas optical gate 714 comprises a flat surface and four protrusions 741 to 744. Each of protrusions 741 to 744 has a reflective surface 741S to 744S (FIG. 7B) respectively that is located opposite to one of four sets of photodiodes and LEDs, such as sets 720 and 730 of printed circuit board 782.

Housing 712 and optical shield 723 of controller 710 have conforming surfaces that do not touch each other when handle 711 is in the neutral position. Spring 718 holds shield 723 in position relative to housing 712 yet allows shield 723 to move. Housing 712 has two pairs of guides (731, 732) and (733, 734) that guide the movement of two opposite protrusions 744 and 741 and thus keep optical gate 714 from rotating. Housing 712 has ledges 735 and 736 that support printed circuit board 782 adjacent to optical gate 714.

Printed circuit board 782 defines a hole 782H through which coiled spring 718 supports hemispherical solid 750. Coiled spring 718 is normally in a compressed state when handle 711 is in a neutral position. Titling handle 711 in any direction bends coiled spring 718 so that coiled spring 718 returns handle 711 to the neutral position when handle 711 is released.

Any number of axes can be controlled by a combination of various controllers of the type described above. For example, the optical position sensing parts of thumbwheel controller 310 (FIG. 3B) and of trigger controller 330 (FIG. 3C) can be combined with handle 711 (FIG. 7B) for controlling a total of four axes. In addition, a controller can be made slidable, as well as rotatable along a Z axis, as illustrated by controller 810 in FIGS. 8A and 8B, for controlling six axes.

Figure 8A:
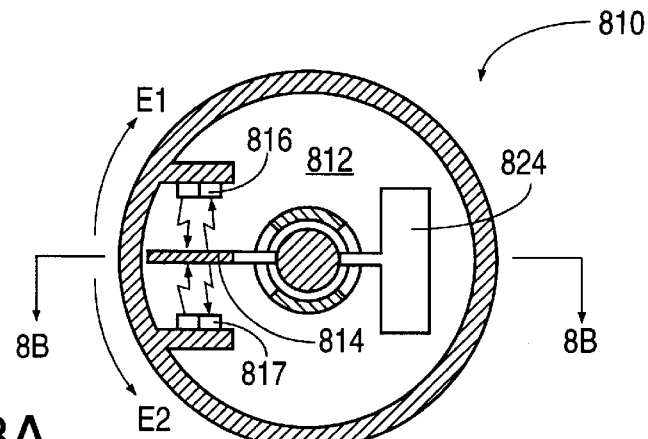
FIGS. 8A and 8B illustrate a multi dimensional controller that has a lower portion identical to lower portion 790 of FIG. 7B and a handle that includes a thumbwheel controller (FIG. 3C) and a trigger controller (FIG. 3D), which handle further includes a controller rotatable and slidable along a longitudinal direction Z.
Figure 8B:
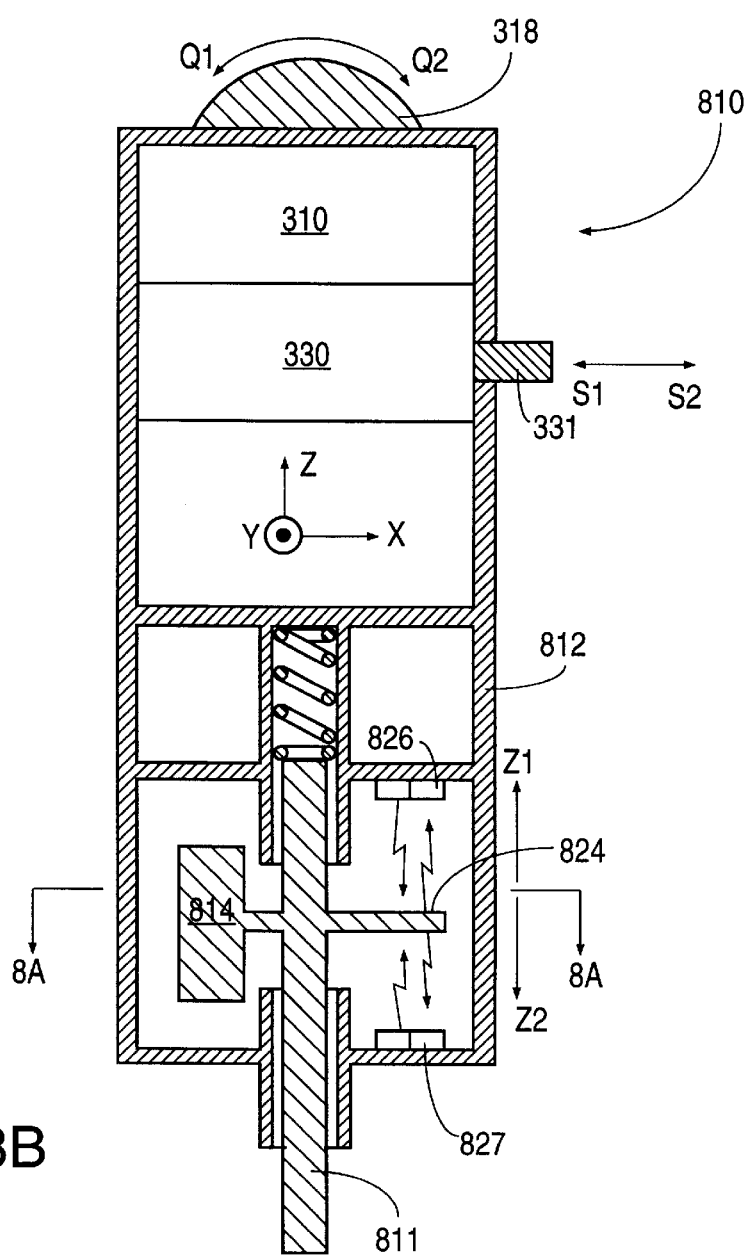

The six axes are illustrated in FIGS. 8A and 8B by arrows X, Y and Z for the three coordinate axes, arrows E1 and E2 for rotation of housing 812, arrows Q1 and Q2 for a rotation of thumbwheel 318 (FIG. 8B) and arrows S1 and S2 for sliding of a trigger 331 (FIG. 8B). Each of these six axes can be used to control, for example a helicopter's blade positions (X and Y axes), tail rotor (Z axis), pitch (arrows E1 and E2), blade speed (arrows S1 and S2) and radio (arrows Q1 and Q2). In a variation of controller 810 for controlling seven axes, instead of a thumbwheel controller, a trackball controller can be substituted. The additional axis in a seven axes controller, can be used to control for example a gun turret of the helicopter.

Controller 810 includes a housing 812 that can be rotated in direction E1 or E2 (FIG. 8A) around a handle 811. For clarity, the elements of thumbwheel controller 310 and trigger controller 330, illustrated in the above described figures, such as FIGS. 3A, 3B, 7A and 7B, are not shown in FIGS. 8A and 8B.

Photodiodes 816 and 817 (FIG. 8A) attached to housing 812 can generate a position signal of the type described below, depending on the position of housing 812 along direction E1 or E2 with respect to optical gate 814 that is attached to handle 811 (FIG. 8B).

A user can slide housing 812 with respect to handle 811 (along longitudinal axis Z), as shown by arrow Z1 or Z2 (FIG. 8B), so that photodiodes 826 and 827 generate a position signal depending on the position of optical gate 824 with respect to housing 812.

Two photodiodes of a position sensing controller can be connected in a novel electrical device, referred to as a "ratiometric sensor" to drive a position signal carried by a controller cable 113 (FIG. 1A), which position signal causes game machine 190 to change the image displayed in television 180, depending on the position of handle 111. A ratiometric sensor, described briefly below in reference to FIGS. 10, 11 and 12, is described in detail in concurrently filed U.S. Pat. No. 5,650,608 application Ser. No. 08/359, 306 that was incorporated by reference above.

To measure the position of a moveable element, a controller uses a photodiode D2 (FIG. 9) coupled in series with resistor R2 that is connected in series with variable resistor R3, between a first reference voltage line 910 (typically connected to a source of approximately constant supply voltage Vcc) and a second reference voltage line 920 (typically connected to ground voltage GND) to form a novel ratiometric sensor 901. A voltage, at the junction of photodiode D2 and resistor R2, henceforth referred to as "ratiometric voltage Vr," is typically Vcc times the ratio Rp/(Rr+Rp) where Rp is equivalent resistance of photodiode D2 and Rr is the resistance of serially connected resistors R2 and R3.

In response to an increase or decrease in incident light, photodiode D1 generates a correspondingly larger or smaller current compared to the neutral current so that equivalent resistance Re decreases or increases and ratiometric voltage Vr decreases or increases. Such a ratiometric sensor 901 converts a small variation in current from a photodiode into a variation in ratiometric voltage Vr, between supply voltage Vcc and ground.

In response to small changes (±0.3 volt in one embodiment) in ratiometric voltage Vr at the base of a Darlington transistor Q1, a large range of current (20 m Amps to 20 μ Amps in one embodiment) is produced by transistor Q1, which current can be used to drive, for example a game port of a personal computer. Darlington transistor Q1 provides a large gain (of 1000 in one embodiment) that is required because a single photodiode (e.g. D2) produces a small change in current (in the order of micro amperes in one embodiment).

A user can tune a potentiometer that includes variable resistor R3 to ensure that ratiometric voltage Vr is such that transistor Q1 is in the center of the linear region, when for example movable element 611 (FIG. 6A) is in a neutral position.

Figure 6C:
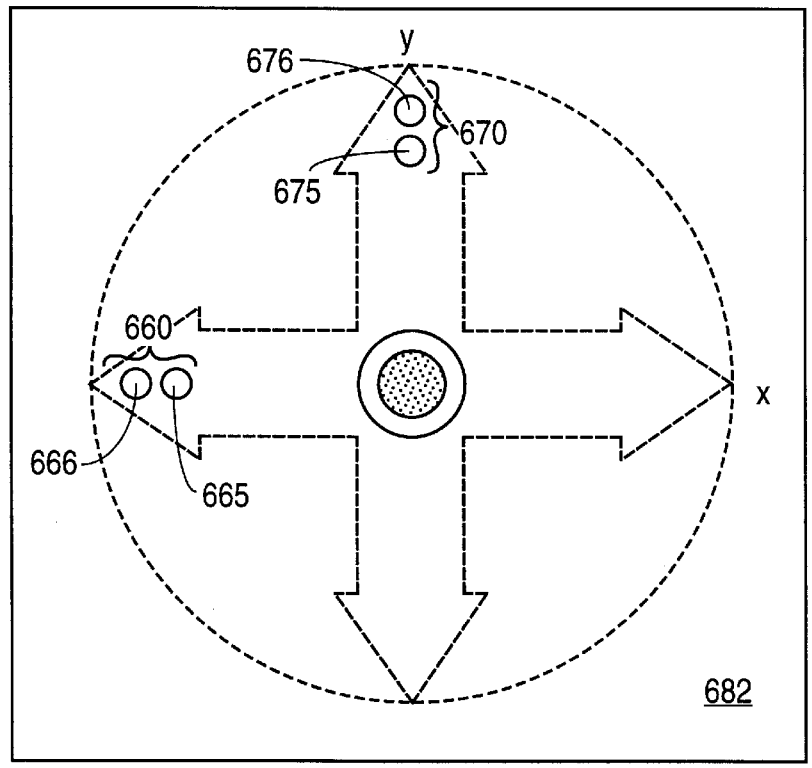

Position sensing circuit 900 includes an additional photodiode D4 in a configuration similar to that described above for photodiode D2, for position measurement along a different axis Y (FIG. 6C). Resistor R1 limits the current through LED D1. Resistor R4 limits the current through transistor Q1 when transistor Q1 is totally turned on. Resistor R5 provides a minimum current at output X on line 940 when transistor Q1 is completely turned off.

Two photodiodes 316 and 317 (FIG. 3A) can be connected to each other in series as illustrated by photodiodes 1016 and 1017 (FIG. 10) between a first reference voltage line 1011 (FIG. 10) and a second reference voltage line 1012 (connected to ground line 1018), to supply a ratiometric voltage Vr on ratiometric sensor output line 1014 that is connected to a junction between photodiodes 1016 and 1017.

The ratiometric voltage Vr is proportional to the ratio A2/(A1+A2) where A1 and A2 are the amounts of light incident on photodiodes 1016 and 1017 respectively. The amount of light incident on each of photodiodes 1016 and 1017 can be changed by an equal percentage and yet the ratio remains the same, immune to such changes, that are typically due to noise.

Resistors R1 and R2 (FIG. 10) limit the amount of current through and hence the amount of light generated by LEDs 1026 and 1027. Capacitor C1 (FIG. 10) filters out any spikes in the voltage supplied to LED 1026 or 1027.

Similar ratiometric voltages are also generated by photodiodes 1116 and 1117 (FIG. 11) and by photodiodes 1156 and 1157 (FIG. 11) on ratiometric sensor output line 1114 that is connected to ratiometric sensor output line 1014 by connector 1050.

A microprocessor 1210 (FIG. 12) can provide multiplexing signals at terminals C3Z, B2Y and A1X, one at a time, to receive the ratiometric signal from each pair of photodiodes, such as photodiode pair 1016 and 1017 (FIG. 10), 1116 and 1117 (FIG. 11), and 1156 and 1157 (FIG. 11).

In response to a trigger signal from microprocessor 1210 (FIG. 12), a monostable multivibrator, such as a CMOS "555" timer 1201 (FIG. 12), can sample the voltage on ratiometric voltage line 1202 that is connected by connector 1150 to ratiometric sensor output lines 1014 and 1114, to supply a pulse width modulated signal that has a pulse width proportional to ratiometric voltage Vr that is immune to fluctuations in reference voltage Vcc. Timer 1201 supplies the pulse width modulated signal on line 1204 that is connected to an input terminal CXYZ of microprocessor 1210.

Microprocessor 1210 can also receive a ratiometric signal from a similar set of six additional photodiodes (not shown) through a connector 1252, to provide a user with three axes of control that are in addition to three axes of control provided through connector 1150 (FIG. 12).

Capacitors C1 and C5 (FIG. 12) filter out spikes in power supply voltage Vcc that is applied to the photodiodes and LEDs of FIGS. 10 and 11. Resistors R3 and R4 together with capacitors C2 and C3, establish a center pulse width corresponding to for example the neutral position of handle 111 (FIG. 1A). Diodes D1 to D7 (FIG. 12) isolate one pin, such as pin C3Z or B2Y from another pin when two buttons that are connected to these two pins are pressed simultaneously. Buttons BS, BR, BL, BX, BY, BZ, BC, BB and BA are dual mode buttons similar to each other that can be used in normal mode or turbo mode.

The following description for the normal mode operation of button BC applies to all buttons including buttons A, B and C (FIG. 10). In a normal mode, one terminal of button BC is connected to ground through pin BE3. When button BC is not pressed, pin C3Z is pulled up by resistor R13. When button BC is pressed, pin C3Z goes to ground through pin BE3.

The following description for turbo mode operation of button BC applies to all dual mode buttons listed above. In the turbo mode, one of the terminals of button BC is connected to pin TB that carries a voltage which oscillates between ground and Vcc (e.g. 5 volts) at a rate determined by potentiometer R6 (explained below). So when button BC is pressed, the voltage on pin C3Z oscillates along with the voltage on pin TB.

A turbo circuit 1290 connected to pin 18 drives the voltage on pin TB. Turbo circuit 1290 includes a capacitor C4 that is initialized to Vcc by pin 18 and is discharged through potentiometer R6 and resistor R5. Microprocessor 1210 measures the discharge time of capacitor C4 to a logic threshold of pin 18 by monitoring the change in state of the signal on pin 18 as the signal changes from a logic 1 to a logic 0. The rate of oscillation of turbo circuit 1290 is inversely proportional to the rate of discharge of capacitor C4, that is in turn proportional to the resistance of potentiometer R6.

In one embodiment, microprocessor 1210 is MC68HC05P1 available from Motorola Inc. of Phoenix, Ariz. and software of microfiche appendix A used for controlling M68HC05P1 is assembled using the M68HC05P9 assembler also available from Motorola Inc.. The software of microfiche appendix A is described in detail in the concurrently filed U.S. Pat. No. 5,650,608 application Ser. No. 08/359,306.

The above description is intended to be illustrative and not restrictive. Many variations of the invention will become apparent to those of skill in the art upon review of this disclosure. For example, a bicycle handle bar or a light dimmer knob can be used as a rotary adjuster in a controller.

Also, an LED and a photodiode that are used as a set can be fabricated into a single package to provide greater precision in the distance and crosstalk between the LED and the photodiode. Packages with identical errors from manufacturing defects can also be used in a ratiometric sensor as the noise is canceled.

The scope of the invention should, not be determined with reference to the above description alone. Many variations and combinations of the embodiments of this invention are encompassed by the appended claims.

We claim:

1. A controller comprising:
   a housing having a portion that forms an enclosure;
   a movable element having an end, said end being located outside said housing, said movable element having a predetermined range of movement with respect to said housing;

a first signal source located in said enclosure, said first signal source being a source of an electromagnetic signal;

a signal gate located in said enclosure;

a first member having a first portion and a second portion opposite said first portion, said first member being supported by said housing, said first portion being attached to said movable element and said second portion being attached to said signal gate, wherein said first member holds said movable element substantially stationary with respect to said signal gate, further wherein said first member holds said signal gate substantially separated from said housing to thereby eliminate friction between said signal gate and said housing;

a first signal sensor located in said enclosure, said first signal sensor being sensitive to the amount of said electromagnetic signal, said amount being determined by said signal gate, said first signal sensor having a first terminal couplable to an electrical circuit; and a second signal sensor located in said enclosure, said second signal sensor having a second terminal wherein said first terminal and said second terminal are directly coupled to a common junction, thereby to supply at said common junction a signal having a ratiometric voltage indicative of said position;

wherein said first member moves said signal gate in dependence on movement of said movable element by a user, and further wherein said signal gate changes the amount of said electromagnetic signal in dependence on at least an angle of reflection or a distance between said signal gate and one of said first signal source and said first signal sensor.

2. The controller of claim 1 further comprising a printed circuit board, wherein said electromagnetic signal is a light signal, each signal source is a light emitting diode, each signal sensor is a photodiode and said signal gate is an optical gate, said first signal sensor and said second sensor being mounted on said printed circuit board at adjacent corners of a cross.

3. The controller of claim 2 wherein said movable element is formed as at least a portion of a rotary adjuster, and said rotary adjuster is capable of only rotary motion with respect to said housing; and further wherein said change in amount of said light signal is indicative of a change in the angle of said rotary adjuster with respect to said housing.

4. The controller of claim 3 wherein said rotary adjuster is a steering wheel.

5. The controller of claim 3 wherein said rotary adjuster is a thumbwheel and further wherein said optical gate is formed as a portion of said rotary adjuster.

6. The controller of claim 1 wherein said housing is formed in the shape of a handle and said movable element is formed as a flexible portion of said handle.

7. The controller of claim 1 wherein said housing is formed in a shape of a handle and said moveable element is formed as a trigger.

8. The controller of claim 1 wherein said signal gate comprises a reflective surface, said reflective surface having a flat white finish.

9. The controller of claim 8 wherein said reflecting surface has an approximately flat shape.

10. The controller of claim 1 wherein said signal gate comprises a reflective surface, said reflective surface having a metallic finish.

11. The controller of claim 1 wherein said support member is slidably mounted on said housing such that said signal gate translates laterally in a first direction in response to movement of said movable element in a second direction, said second direction being identical to said first direction.

12. The controller of claim 1 wherein said signal gate is formed as a surface of a solid.

13. The controller of claim 1 wherein said amount depends on a distance of said signal gate from at least one of said first signal sensor and said first signal source.

14. The controller of claim 1 wherein said amount depends on an angle of reflection between said signal gate and at least one of said first signal sensor and said first signal source.

15. The controller of claim 1, wherein said amount depends on a distance of said signal gate from at least one of said first signal sensor and said first signal source; and further wherein said amount also depends on an angle of reflection between said signal gate and at least one of said first signal sensor and said first signal source.

16. The controller of claim 1 further comprising a spring, said spring having a first end coupled to said housing and a second end coupled to said movable element such that said spring returns said movable element to a neutral position on release of said movable element at a position other than said neutral position.

17. The controller of claim 1, wherein said first terminal and said second terminal are each connected to the other via said common junction without any intervening device between said first terminal and said second terminal.

18. The controller of claim 17, wherein said ratiometric voltage is proportional to the ratio A2/(A1+A2) wherein A1 and A2 are amounts of electromagnetic signal incident on said first signal sensor and said second signal sensor, respectively.

19. The controller of claim 17, wherein said ratiometric voltage is immune to equal percentage change in the amounts of light incident on each of said first signal sensor and said second signal sensor.

20. The controller of claim 1, wherein said housing has a floor and a ceiling located opposite said floor, said ceiling defining an opening, said controller further comprising a second member having a proximal end and a distal end, said proximal end being coupled to said signal gate and said distal end being coupled to said floor.

21. The controller of claim 20, wherein said second member includes a flexible rod, and said controller further comprises a flexible membrane located adjacent to said ceiling around said opening.

22. The controller of claim 21, wherein said flexible rod and said housing are portions of an integral structure formed of an injection molded plastic.

23. A controller comprising:

a housing defining an interior enclosure;

a movable element located outside said housing and having a limited range of movement with respect to said housing;

a support member having a proximal end and a distal end opposite said proximal end, said proximal end being attached to said movable element;

an optical gate attached to said distal end, said optical gate being located in said enclosure, wherein said support member holds said optical gate separated from said housing to thereby eliminate friction between said optical gate and said housing, and further wherein said support member holds said optical gate substantially stationary with respect to said movable element and causes said optical gate to move laterally from a first location to a second location in dependence on movement of said movable element, said second location being removed from said first location; and a plurality of photodiodes located in said enclosure, a first photodiode of said plurality of photodiodes being physically separated from a second photodiode of said plurality of photodiodes;

wherein said first photodiode drives a first current indicative of the amount of light incident on said first photodiode and said second photodiode drives a second current indicative of the amount of light incident on said second photodiode; and further wherein said first photodiode has a first terminal said second photodiode has a second terminal, said first terminal and said second terminal being directly coupled to a common junction, thereby to supply at said common junction a signal having a ratiometric voltage indicative of said position.

24. The controller of claim 23 wherein said movable element comprises a rotary adjuster capable of only rotary movement with respect to said housing and further wherein rotation of said rotary adjuster in a first direction moves said optical gate closer to said first photodiode and farther from said second photodiode.

25. The controller of claim 24 wherein said rotary adjuster is a steering wheel.

26. The controller of claim 24 wherein said rotary adjuster is a thumbwheel.

27. The controller of claim 23 wherein said movable element comprises a sliding adjuster capable of only sliding movement with respect to said housing and further wherein sliding said sliding adjuster in a first direction moves said optical gate closer to said first photodiode and farther from said second photodiode.

28. The controller of claim 27 wherein said sliding adjuster is a slider of an entertainment system and further wherein said sliding movement is moving along a straight line.

29. The controller of claim 27 wherein said sliding adjuster is a trigger.

30. The controller of claim 23 wherein said optical gate comprises a dual lens light emitting diode having a first lens and a second lens, wherein said first lens is located opposite said first photodiode and said second lens is located opposite said second photodiode.

31. The controller of claim 23 wherein said optical gate comprises a reflective surface and said controller further comprises a pair of light sources attached to said housing opposite said reflective surface, wherein a first light source is located adjacent said first photodiode and a second light source is located adjacent said second photodiode.

32. The controller of claim 23 wherein said circuit outputs a ratiometric position signal that indicates the ratio of the first electrical signal to the sum of the first electrical signal and the second electrical signal.

33. The controller of claim 32 wherein said ratiometric position signal indicates a voltage fraction of a reference voltage.

34. The controller of claim 23 wherein said movable element comprises a tilt adjuster capable of only tilt movement with respect to said housing and further wherein a tilting said tilt adjuster in a first direction moves said optical gate closer to said first photodiode and farther from said second photodiode.

35. The controller of claim 34 wherein said tilt adjuster includes a trackball.

36. The controller of claim 34 wherein said tilt adjuster includes a handle.

37. The controller of claim 23 wherein said support member is slidably mounted on said housing such that said optical gate translates laterally in a first direction in response to movement of said movable element in a second direction, said second direction being identical to said first direction.

38. The controller of claim 23 wherein said optical gate is formed as a surface of a solid.

39. The controller of claim 23 wherein said at least one of said amounts depends on a distance of said signal gate from at least one of said first signal sensor and said first signal source.

40. The controller of claim 23 wherein said at least one of said amounts depends on an angle of reflection between said optical gate and at least one of said first signal sensor and said first signal source.

41. The controller of claim 23, wherein a first amount depends on a distance of said optical gate from said first photodiode; and further wherein said first amount also depends on an angle of reflection between said optical gate and said first photodiode.

42. The controller of claim 23 further comprising a spring, said spring having a first end attached to said housing and a second end coupled to said movable element such that said spring returns said movable element to a neutral position on release of said movable element at a position other than said neutral position.

43. The controller of claim 42 wherein said movable element comprises a sliding adjuster and further wherein second end of said spring is coupled to said sliding adjuster through said support member.

44. The controller of claim 23, wherein said first terminal and said second terminal are each connected to the other via said common junction without any intervening device between said first terminal and said second terminal.

45. The controller of claim 44, wherein said ratiometric voltage is proportional to the ratio A2/(A1+A2) wherein A1 and A2 are amounts of electromagnetic signal incident on said first signal sensor and said second signal sensor, respectively.

46. The controller of claim 44, wherein said ratiometric voltage is substantially immune to noise in the light incident on each of said first photodiode and said second photodiode.

47. The controller of claim 23, wherein said housing has a floor and a ceiling located opposite said floor, said ceiling defining an opening, said controller further comprising a flexible member having a first end and a second end, said first end being coupled to said optical gate and said second end being coupled to said floor.

48. The controller of claim 47, wherein said flexible member includes a rod, and said controller further comprises a flexible membrane located adjacent to said ceiling around said opening.

49. A controller comprising:

a housing defining an interior enclosure, said housing having a floor and a ceiling located opposite said floor, said ceiling defining an opening;

a movable element;

a support member having a proximal end and a distal end opposite said proximal end, one end of said movable element being attached to said proximal end such that another end of said movable element is located outside said housing, said support member being separated from said housing;

an optical gate attached to said distal end such that said optical gate is located in said enclosure;

a flexible member supported by said housing, said flexible member having a first end and a second end, said first end being coupled to said optical gate and said second end being coupled to said floor;

wherein said flexible member movably supports said optical gate, said optical gate being separated from said housing to thereby eliminate friction between said optical gate and said housing;

a plurality of photodiodes located in said enclosure, a first photodiode of said plurality of photodiodes being physically separated from a second photodiode of said plurality of photodiodes;

wherein said first photodiode drives a first current indicative of the amount of light incident on said first photodiode and said second photodiode drives a second current indicative of the amount of light incident on said second photodiode; and further wherein said controller is at least substantially frictionless except for friction in said flexible member.

50. The controller of claim 49 wherein said flexible member is a rod.

51. The controller of claim 50 wherein said flexible member is a spring.

52. The controller of claim 49 wherein said flexible member comprises a rod rigidly connected to said housing at said second end.

53. The controller of claim 49 wherein said optical gate is formed as a surface of a solid.

54. The controller of claim 49 wherein said support member moves laterally in a first direction in response to movement of said movable element in a second direction, said second direction being identical to said first direction.

55. The controller of claim 49 wherein said at least one of said amounts depends on an angle of reflection between said optical gate and at least one of said photodiodes.

56. The controller of claim 49 wherein said flexible member is oriented substantially in line with said support member, when said movable element is in a neutral position.

* * * * *